(12) United States Patent
Ogawa et al.

(10) Patent No.: US 7,054,705 B2
(45) Date of Patent: May 30, 2006

(54) METHOD OF MANUFACTURING SEMICONDUCTOR DEVICES

(75) Inventors: Sumio Ogawa, Higashihiroshima (JP);
Minoru Ueki, Higashihiroshima (JP);
Shinichi Hara, Shimonoseki (JP)

(73) Assignee: NEC Electronics Corporation, Kanagawa (JP)

( * ) Notice: Subject to any disclaimer, the term of this patent is extended or adjusted under 35 U.S.C. 154(b) by 720 days.

(21) Appl. No.: 10/044,964

(22) Filed: Jan. 15, 2002

(65) Prior Publication Data

US 2002/0059012 A1     May 16, 2002

Related U.S. Application Data

(62) Division of application No. 09/814,871, filed on Mar. 23, 2001, now Pat. No. 6,349,240.

(30) Foreign Application Priority Data

Mar. 27, 2000  (JP) .............................. 2000-087480

(51) Int. Cl.
*G06F 19/00* (2006.01)
(52) U.S. Cl. .................... 700/121; 702/185; 716/4; 438/15
(58) Field of Classification Search ............... 702/185; 716/4; 438/14
See application file for complete search history.

(56) References Cited

U.S. PATENT DOCUMENTS

| | | | |
|---|---|---|---|
| 5,294,812 A | 3/1994 | Hashimoto et al. | |
| 5,301,143 A | 4/1994 | Ohri et al. | |
| 5,497,381 A | 3/1996 | O'Donoghue et al. | |
| 5,642,296 A | 6/1997 | Saxena ........................ 702/84 |
| 5,844,850 A | 12/1998 | Tsutsui et al. | |
| 5,886,909 A | 3/1999 | Milor et al. .................... 716/4 |
| 5,923,553 A | 7/1999 | Yi ............................. 700/110 |
| 5,963,881 A | 10/1999 | Kahn et al. | |
| 6,009,545 A * | 12/1999 | Tsutsui et al. .............. 714/718 |

(Continued)

FOREIGN PATENT DOCUMENTS

JP       4-288811       10/1992

(Continued)

OTHER PUBLICATIONS

Seiichiro, "Semiconductor Device and its Manufacture," Patent Abstracts of Japan, vol. 1999, No. 5, May 31, 1999, JP 11 045839, Feb. 16, 1999, Denso Corp., Abstract.

(Continued)

*Primary Examiner*—Leo Picard
*Assistant Examiner*—Sheela S. Rao
(74) *Attorney, Agent, or Firm*—Foley & Lardner LLP

(57) ABSTRACT

A semiconductor device manufacturing system is provided in which chip position information is read without removing resin from a package so that the cause of a failure can be quickly identified and removed and the yield of chips can be rapidly improved. A replacement address reading device reads redundancy addresses from a semiconductor device which is determined as faulty in a test performed after the semiconductor device has been sealed into a package. A chip position analyzing device estimates, from the combination of these redundancy addresses, a lot number, a wafer number and a chip number of the faulty semiconductor device. A failure distribution mapping device maps the distribution of faulty chips in each wafer in the lot based on these numbers thus obtained. A failure cause determining device identifies which manufacturing device or processing step has caused the failures in the wafer process based on the above distribution.

7 Claims, 23 Drawing Sheets

U.S. PATENT DOCUMENTS

| | | | |
|---|---|---|---|
| 6,112,130 A | 8/2000 | Fukuda et al. | 700/121 |
| 6,131,052 A | 10/2000 | Ban et al. | 700/121 |
| 6,143,584 A | 11/2000 | Fukada et al. | |
| 6,192,291 B1 | 2/2001 | Kwon | 700/121 |
| 6,194,235 B1 | 2/2001 | Ma | 438/14 |

FOREIGN PATENT DOCUMENTS

| | | |
|---|---|---|
| JP | 7-085697 | 3/1995 |
| JP | 10-233350 | 9/1998 |
| JP | 10-339943 | 12/1998 |
| JP | 11-45839 | 2/1999 |
| JP | 11-045839 | 2/1999 |
| JP | 11-045919 | 2/1999 |
| JP | 11-161917 | 6/1999 |

OTHER PUBLICATIONS

Kibarian et al., "Using Spatial Information to Analyze Correlations Between Test Structure Data," IEEE Transactions on Semiconductor Manufacturing, vol. 4, No. 3, Aug. 1991, pp. 219-225, XP002201314.

U.S. Appl. No. 10/044,963, filed Jan. 15, 2002, Ogawa et al.

* cited by examiner

FIG. 4

| PRODUCT NAME | LOT NUMBER | WAFER NUMBER | STEP NAME | MANUFACTURING TIME AND DATE | MANUFACTURING MACHINE NO. | MANUFACTURING CONDITION |
|---|---|---|---|---|---|---|
| UPD123 | CB95-3030 | W01 | STEP A | 20000101 | MACHINE NO. H5 | 5021 |
| | | | STEP B | 20000102 | MACHINE NO. L3 | 4791 |
| | | | ... | ... | ... | ... |
| | | W02 | STEP A | 20000101 | MACHINE NO. H6 | 5021 |
| | | | STEP B | 20000102 | MACHINE NO. L7 | 4791 |
| | | ... | ... | ... | ... | ... |
| | | ... | ... | ... | ... | ... |
| ... | ... | ... | ... | ... | ... | ... |

FIG. 5

| PRODUCT NAME | LOT NUMBER | WAFER NUMBER | CHIP NUMBER | TEST ITEM | TEST TIME AND DATE | TEST MACHINE NUMBER | TEST CONDITION | TEST RESULT | JUDGMENT RESULT |
|---|---|---|---|---|---|---|---|---|---|
| UPD123 | CB95-3030 | W01 | C06,31 | ITEM A | 20000103 | MACHINE NO. T4 | 7252 | 28 | PASS |
| | | | | ITEM B | 20000103 | MACHINE NO. T4 | 5834 | PASS | |
| | | | | ... | ... | ... | ... | ... | |
| | | | C06,32 | ITEM A | 20000103 | MACHINE NO. T4 | 7252 | 34 | FAIL |
| | | | | ITEM B | 20000103 | MACHINE NO. T4 | 5834 | FAIL | |
| | | | ... | ... | ... | ... | ... | ... | ... |
| ... | ... | ... | ... | ... | ... | ... | ... | ... | ... |

←—— WAFER CHIP INFORMATION ——→  ←—— WAFER TEST INFORMATION ——→

FIG. 7

| PRODUCT NAME | LOT NUMBER | ASSEMBLY LOT NUMBER | WAFER NUMBER | CHIP NUMBER | SAMPLE NUMBER | TEST ITEM | TEST TIME AND DATE | TEST MACHINE NUMBER | TEST CONDITION | TEST RESULT | JUDGMENT RESULT |
|---|---|---|---|---|---|---|---|---|---|---|---|
| UPD123 | CB95 -3030 | 35ER-008 | W01 | C06, 31 | 007 | ITEM K | 20000107 | MACHINE NO. H2 | 7251 | 27 | FAIL |
| | | | | | | ITEM L | 20000107 | MACHINE NO. H2 | 5832 | FAIL | |
| | | | | | | ⋮ | ⋮ | ⋮ | ⋮ | ⋮ | |
| | | | | — | — | ITEM K | 20000107 | MACHINE NO. H2 | 7251 | 26 | PASS |
| | | | | | | ITEM L | 20000107 | MACHINE NO. H2 | 5832 | PASS | |
| ... | ... | ... | ... | ... | ... | ... | ... | ... | ... | ... | ... |
| ... | ... | ... | ... | ... | ... | ... | ... | ... | ... | ... | ... |

←— ASSEMBLY CHIP INFORMATION —→  ←— ASSEMBLY TEST INFORMATION —→

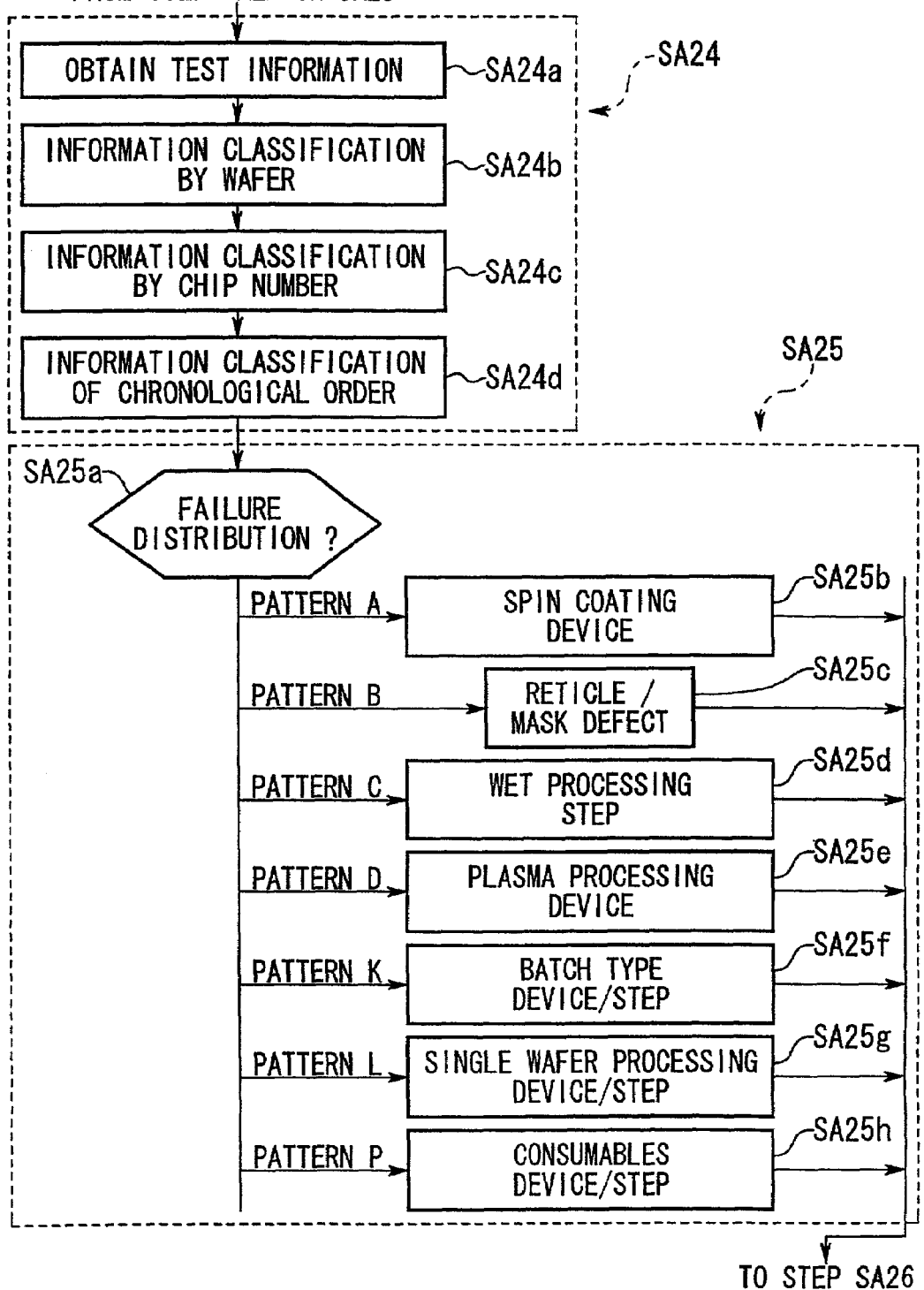

FIG. 9

| FAILURE DISTRIBUTION PATTERN | | FAILURE CAUSE | IMPROVEMENT AREA |
|---|---|---|---|
| A | | WHEN PROCESSING SOLVENT IS COATED ON ROTATING WAFER, LIQUID LEFT IN NOZZLE DRIPS AND MAKES FILM THICKNESS INCONSISTENT, AND HENCE CONTACT FAILURE OCCURS. | ·RESIST COATING DEVICE<br><br>·SOG FILM DEPOSITING DEVICE |
| B | | WHEN A PLURALITY OF CHIPS IS EXPOSED AT THE SAME TIME IN RETICLE, IF A PART OF RETICLE IS DEFECTIVE, FAILURES OCCUR AT A SPECIFIC LOCATION IN EACH EXPOSURE. | ·RETICLE |
| C | | WHEN VERTICALLY MOUNTED WAFER IS IMMERSED IN PROCESSING LIQUID, DIFFERENCE IN PROCESSING TIME OCCURS BETWEEN UPPER AND LOWER PART OF THE WAFER, AND HENCE FAILURES OCCUR CONCENTRATED IN THE UPPER PART OR LOWER PART. | ·WET ETCHING DEVICE /STEP<br>·BATCH TYPE CLEANING DEVICE /STEP |
| D | | IN THE PLASMA ETCHING DEVICE, ELECTRIC FIELD BECOMES INCONSISTENT IN THE PERIPHERY OF THE WAFER, AND HENCE FAILURES OCCUR IN THE PERIPHERY OF THE WAFER. | ·PLASMA PROCESSING DEVICE |
| ⋮ | | ⋮ | ⋮ |

FIG.10

| FAILURE DISTRIBUTION PATTERN | | FAILURE CAUSE | IMPROVEMENT AREA |
|---|---|---|---|
| K | 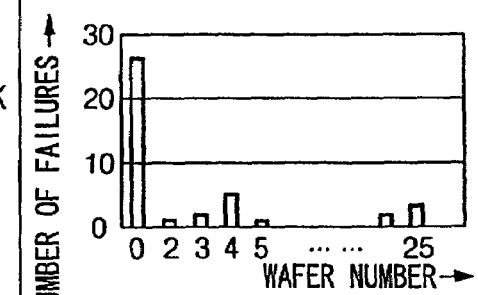 | IN BATCH TYPE PROCESS STEP, PROCESSING LIQUID /GAS BECOMES INCONSISTENT BETWEEN THE FIRST WAFER AND THE SECOND AND LATER WAFERS SO THAT FAILURES OCCUR FREQUENTLY ONLY ON THE FIRST WAFER. | ·BATCH TYPE WET ETCHING DEVICE/STEP<br>·BATCH TYPE THERMAL DIFFUSION DEVICE/STEP<br>·BATCH TYPE THERMAL OXIDATION DEVICE/STEP<br>·FURNACE TUBE |
| L | 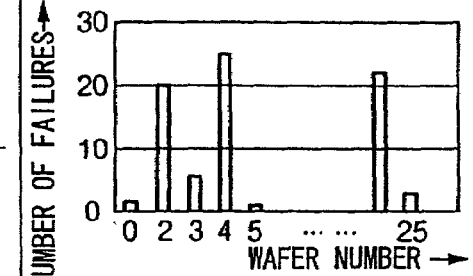 | IN SINGLE WAFER TYPE PROCESSING DEVICE, IF A SPECIFIC MACHINE IS FAULTY, FAILURES OCCUR FREQUENTLY FOR THE MACHINE NUMBER. | ·SINGLE WAFER TYPE CVD DEVICE/STEP<br>·SINGLE WAFER TYPE EXPOSURE DEVICE/STEP<br>·SINGLE WAFER TYPE ETCHING DEVICE/STEP |
| ⋮ | ⋮ | ⋮ | ⋮ |
| P | 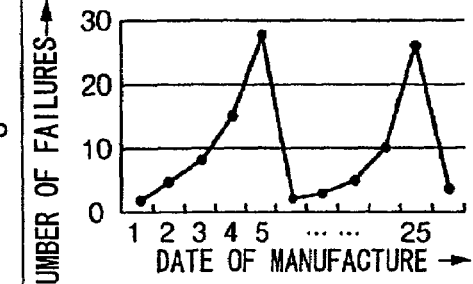 | IN A SPECIFIC TEST ITEM AND MANUFACTURING DEVICE, IF THERE IS ABRASION AND THE LIKE IN THE EQUIPMENT, FAILURE RATE INCREASES OVER TIME. | ·VACUUM PACKING EQUIPMENT<br>·OBSOLESCENCE OF LIQUID IN PROCESS WITH RECIRCULATING ETCHING LIQUID<br>·SENSITIVITY OF SENSOR DROP |
| ⋮ | ⋮ | ⋮ | ⋮ |

FIG. 12

```
PRODUCT NAME : ("LOT NO"."LOT NAME")              ~R2
~R1

:WAFER NO. ("WXX01")    ... :VREF FUSE NO. (FY101")    ... :VREF FUSE NO. (FY102")    ...
R3                          R4                              R5
:CHIP NO. ("CA001")     ... :ROW FUSE NO. ("FB101")    ... :ROW FUSE NO. ("FB102")    ...
R6                          R7                              R8
:COL FUSE NO. ("FC101") ...
R9
:CHIP NO. ("CA002")     ... :ROW FUSE NO. ("FB201")    ... :ROW FUSE NO. ("FB202")    ...
R11                         R10                             R13
:COL FUSE NO. ("FC201") ... :COL FUSE NO. ("FC202")    ...
R14                         R12
                                                            R15
... ;TERMINATION DELIMITER OF WAFER INFORMATION ("/E")
                                                            R16

:WAFER NO. ("WXX02")    ... :VREF FUSE NO. (FY201")    ... :VREF FUSE NO. (FY202")    ...
R17                         R18                             R19
:CHIP NO. ("CB101")     ... :ROW FUSE NO. ("FD101")    ... :ROW FUSE NO. ("FD102")    ...
R20                         R21                             R22
:COL FUSE NO. ("FE101") ... :COL FUSE NO. ("FE102")    ...
R23                         R24

... ;TERMINATION DELIMITER OF WAFER INFORMATION ("/E") ;
                                                            R25
```

FIG. 14

| ROW FUSE FIRST NO. ("F101". GR1) | ~~R51

| ROW FUSE FIRST NO. ("F109". GR2) | ~~R52

.
.
.

| COL FUSE FIRST NO. ("F501". GL1) | ~~R61

| COL FUSE FIRST NO. ("F509". GL2) | ~~R62

```
PRODUCT NAME
LOT NAME ("LOT NO", CB95-3030)
WAFER NO. ("W0001")
VREF FUSE NO. ("FY101")
VREF FUSE NO. ("FY102")
          ⋮
CHIP NO. ("CA001")
ROW FUSE NO. ("F101")
ROW FUSE NO. ("F103")
ROW FUSE NO. ("F106")
ROW FUSE NO. ("F108")
ROW FUSE NO. ("F110")
ROW FUSE NO. ("F113")
ROW FUSE NO. ("F114")
ROW FUSE NO. ("F115")
          ⋮
COL FUSE NO. ("F501")
COL FUSE NO. ("F503")
COL FUSE NO. ("F506")
COL FUSE NO. ("F507")
COL FUSE NO. ("F509")
COL FUSE NO. ("F512")
COL FUSE NO. ("F514")
COL FUSE NO. ("F516")
          ⋮
TERMINATION DELIMITER OF WAFER INFORMATION ("/E")
          ⋮
```

FIG. 16

| R60 | R61 | R62 | R63 | R64 |
|---|---|---|---|---|
| DATE | LotNAME | WaferNumber | ChipName | Vrefnumber |
| XXXX | CB95-3030 | W0001 | C06, 31 | 4 |

| R65 | R66 | R67 |  |  |  | R70 |  |  |  |
|---|---|---|---|---|---|---|---|---|---|
| GR1 | GR2 | GR3 | GR4 | GR5 | GR6 | GR7 | GR8 | GR9 | ...... |
| 3 | A | – | – | C | D | 4 | – | – | |

| R68 | R69 |  |  |  |  |  |  |  |  |
|---|---|---|---|---|---|---|---|---|---|
| GL1 | GL2 | GL3 | GL4 | GL5 | GL6 | GL7 | GL8 | GL9 | ...... |
| A | 1 | – | – | 5 | – | – | 9 | 7 | |

| R71 | R72 |
|---|---|
| ChipName | Vrefnumber |
| C06, 32 | 5 |

X-Redundancy RoLL C

| FUSE | REDUNDANCY ADDRESS | |
|---|---|---|
| F101 ~F108 | 3 | ----R301 |
| F109 ~F116 | A | ----R302 |
| F117~F124 | UNUSE | ----R303 |

.
.
.

Y-Redundancy RoLL C

| FUSE | REDUNDANCY ADDRESS | |
|---|---|---|
| F501 ~F508 | A | ----R351 |
| F509 ~F516 | 1 | |
| F517 ~F524 | UNUSE | |

| R401 | R402 | R403 | R404 | R505 |
|---|---|---|---|---|
| WAFER STEP LOT NO | ASSEMBLY LOT NO | WAFER NO | CHIP NO | SAMPLE NO |
| CB95-3030 | 35er008 | W01 | C06, 31 | 1 |
| CB95-3030 | 35er008 | W01 | C06, 32 | 2 |
| . | . | . | . | . |
| . | . | . | . | . |
| . | . | . | . | . |

US 7,054,705 B2

METHOD OF MANUFACTURING SEMICONDUCTOR DEVICES

CROSS REFERENCE TO RELATED PATENT APPLICATIONS

This application is a division of U.S. Pat. No. 6,349,240, issued Feb. 9, 2002, and based on Japanese Patent Application No. 2000-87480, filed Mar. 27, 2000, by Sumio OGAWA, Minoru UEKI and Shinichi HARA. This application claims only subject matter disclosed in the parent application and therefore presents no new matter.

BACKGROUND OF THE INVENTION

1. Field of the Invention

This invention relates to a semiconductor device manufacturing system for determining the cause of failures in a semiconductor device which has become faulty after the division of a wafer into a plurality of chips, and also to a method of manufacturing semiconductor devices as well as a failure analyzing device.

2. Description of the Related Art

In recent years, the life cycle of electronic devices has been becoming shorter and shorter, and it has become imperative for developers to complete the designs of such electronic devices in a short period of time and to supply them to the market in a timely fashion. While the performance of semiconductor devices mounted in electronic equipment has been improved and the goal of obtaining a higher integration of circuits on a chip has been substantially achieved, a further reduction in the cost of such semiconductor devices is also an objective.

Semiconductor devices are usually manufactured by subjecting a semiconductor wafer to predetermined processing steps (wafer process) by means of several tens of types of manufacturing devices (hereinafter called collectively as "a manufacturing line"). In order to supply semiconductor devices stably at low cost, the number of non-defective products obtained from one sheet of wafer (hereinafter referred to as "yield") or its rate (hereinafter referred to as "yield rate") must be raised.

In general, the manufacturing devices are complicated in their construction and include many factors causing the yield rate to be lowered. Also, the yield rate will largely depend on how the manufacturing devices are used and the set conditions for the processing steps.

When starting mass-production of newly developed semiconductor devices or when adding a new manufacturing device to the manufacturing line, the manager of the manufacturing line analyses causes of failures and improves the manufacturing line and the processing steps in an effort to attain a desired yield rate.

Even after the desired yield rate has been attained, the manager of the manufacturing line endeavors to maintain a stable yield rate by always monitoring the manufacturing line in order to detect in advance any sign of a deteriorating yield rate.

Thus, unless the development of the processing steps necessary for the high-degree integration of circuits and the stabilization of such processing steps have been completed as quickly as possible, it is quite difficult to ship the needed semiconductor devices stably within an acceptable time period.

Therefore, for the development of the manufacturing line and the processing steps necessary for the manufacturing of semiconductor devices and the stabilization thereof, it is critical that the failures of the produced semiconductor devices are analyzed, that the causes of failures revealed as a result of such analysis are eliminated and to solve the problems of the manufacturing line and the processing steps which lead up to these problems.

However, since there are several tens of manufacturing devices and hundreds of processing steps involved in the manufacture of one semiconductor device, a big problem is how to quickly find in which manufacturing device or in which processing step the failure occurred. A method of finding the cause of failures has been known in which the detection is done based on the distribution of failures on the wafer of faulty semiconductor devices and the dependency of the failures on the position of wafer in the lot.

More specifically, the manufacturing device or the processing step by which semiconductor devices become faulty can be determined based on the distribution of chips of the faulty semiconductor devices on the wafer and the position of that wafer in the lot.

Japanese Unexamined Patent Application, First Publication, No. Hei 11-45919 (hereinafter referred to as "first related art") discloses a method in which, when semiconductor substrates (wafers) are manufactured by means of a manufacturing line comprising a plurality of manufacturing devices and desired manufacturing processes (processing steps), such a determination is made based on an inspection step for inspecting the plurality of manufactured semiconductor substrates for the positions of the failures brought about on each semiconductor substrate by means of an inspection device, a failure distribution image data mapping step for designating coordinates of the position data of failures of each semiconductor substrate inspected in the inspection step on an image data composed of pixels arranged on the semiconductor substrate in a grid form and for mapping failure distribution image data on the image data by counting the numbers of failures of the plurality of semiconductor substrates for each of the grid-arranged pixels, and a failure analysis step for comparing the failure distribution image data formed in the failure distribution image data mapping step with a plurality of case databases, from which the cause of failures can be determined, to thereby identify the cause of the failures.

For example, when the distribution of failures on a wafer 100 corresponds to a pattern 111 shown in FIG. 23, it can be determined, by comparing the pattern with the case databases produced in the past, that the cause may exist in the step A. When the distribution of failures corresponds to a pattern 113, it can be determined that the cause may exist in the step C.

In the case of a process wherein one lot of wafers are processed by means of a plurality of manufacturing devices of the same type (manufacturing machine No. A and manufacturing machine No. B) in a single wafer processing, if the number of patterns 115 of the distribution of failures on wafers manufactured by the manufacturing machine No. B is greater than the number of patterns 114 of the distribution of failures on wafers manufactured by the manufacturing machine No. A as shown in FIG. 24, it can then be determined that the cause exists in the manufacturing machine No. B.

Although not disclosed in the document of the first related art, a case may happen where faulty semiconductor devices are concentrated in the lower area 102 of each wafer 100 in all the lots of wafers processed at the same time, as shown in FIG. 25. In such a case, it will be assumed that the cause of failures may exist in an immersion wet etching process where a resist or an oxide film was removed. The reason for this is that when a wafer is immersed in an etchant and then raised, the immersion time of the wafer is longer in the lower portion than in the higher portion, and in addition the etchant flows in the direction of the lower portion when the wafer is raised, so that a pattern or a thin film in the lower portion 102 of the wafer is more deeply etched.

Another case may occur where faulty semiconductor devices are concentrated in the peripheral area of the wafer 100. In this case, it can be determined that the cause of the failures is a plasma etching device. The reason for this is that the electric field may be uneven in the peripheral area in such a device.

When the number of semiconductor devices which have been judged to be faulty in a wafer numbered W1, is significantly high as compared to other wafers numbered W2 to W25 in the same lot, it may be assumed that the cause is a batch type processing step. For example, as shown in FIG. 26, the wafers numbered W1 to W25 are arranged in a direction perpendicular to their main surfaces in a carrier 502 and subjected to a wet etching with a processing liquid 501 in a processing vessel 500. In this case, each of the wafers numbered W1 to W25 is formed with circuits of semiconductor devices on that surface which is indicated by an arrow A. Each of the wafers numbered W2 to W25 has a little space on the side of the upper surface, so that the etchant already reacted tends to remain on the surface. In contrast, the wafer numbered W1 has a lot of fresh etchant on the upper surface as compared to the other wafers, so that the etching process progresses faster.

Japanese Unexamined Patent Application, First Publication, No. Hei 10-339943 (hereinafter referred to as "second related art") discloses a method of manufacturing a semiconductor device comprising a step of exposure by means of projection through a mask or a reticle, in which chip coordinates are used to specify each position of chip on the exposed semiconductor wafer, determination then being made from the chip-coordinate data of faulty chips present on the exposed semiconductor wafer whether these faulty chips are caused by the mask or the reticle, so that the positions of failures in the mask or reticle can easily be detected in a short period of time.

When those semiconductor devices which are detected as faulty are cyclically located on the wafer 100 as shown in FIG. 27, it can be inferred that the mask or the reticle 101 may be the cause. It is here assumed that one reticle 101 is formed by four semiconductor device patterns (or exposure units) and that a failure exists in a specific area 101a thereof. When printing is made with this reticle 101 on a resist on the wafer by a stepper, failures will cyclically occur on the wafer corresponding to the specific position within the exposure unit as shown in FIG. 27. In FIG. 27, those chips marked with "x" are faulty chips.

As described above, a processing step causing failures can be identified based on the dependency of semiconductor devices which have been determined to be faulty because of their chip positions and the dependency of faulty wafers on their positions in the lot.

At present, in the analysis of failures with respect to a processing step, the identification of the process step which may have caused failures in semiconductor devices is performed based on an inspection of semiconductor devices in a wafer state.

After that, only those semiconductor devices which have passed the inspection by a wafer tester with respect to predetermined items are sealed in packages and assembled. Each semiconductor in this state is called an assembly. Thereafter, each assembly is further inspected by an assembly tester. In this case, since the number of inspection items is greater than that in the inspection made in the wafer state, those failures which have not been removed by the wafer tester can be detected, and at the same time those failures which have occurred in the assembling stage can also be detected and removed. Only those semiconductor devices which have passed these inspections are shipped as products.

The test of semiconductor devices in a wafer state is carried out by means of an expensive inspection device (a wafer tester). In this case, however, it is not possible to perform a high-speed test of operation in a wafer state due to the facts that the probe has parasitic capacitance and that it is not possible to provide in the time available a wafer tester possessing a speed comparable to the enhanced speed of semiconductor devices. Also, it is inefficient to perform, in a wafer state, tests about special items such as a breakdown test in which a high voltage is applied and an environmental test which is carried out at room, low and high temperatures. In addition, since a plurality of semiconductor devices are formed on the same semiconductor substrate in a wafer state, there is another problem that it is not possible to carry out a test on such items without the possibility that interference with other chips may occur.

Furthermore, a large number of semiconductor devices cannot be tested simultaneously, since control signals and data must be conveyed to input/output pads of semiconductor devices through a limited number of probes. In other words, the testing of semiconductor devices in a wafer state has a significant disadvantage since the number of semiconductor devices which can be tested simultaneously is limited, and the production efficiency is decreased when the test is performed in relation to many operational and electric characteristics. These are the various contributing factors that explain why the number of tests for semiconductor devices in a wafer state cannot be increased.

When testing chips in the wafer state one by one, in order to maintain productivity, a limited number of test items must be selected and twenty of these items must be processed within a test period of five minutes. In contrast, in the case of assemblies, 64 to 128 pieces can be mounted on a test board and a large number of such test boards can be subjected to a test in parallel, so that even when there are 400 items to be tested and a test period of two hours is needed therefor, the time period needed for the test for each semiconductor can be shortened.

The semiconductor devices which are judged to be faulty after assembly is not high in number as compared to the failures in the wafer test, but still exist to a certain degree. It is therefore necessary to decrease as quickly as possible not only the failure rate in the wafer stage but also the failure rate of the assemblies. However, once assembled in a package, the assembly no longer contains the information about its position in the wafer and consequently, the detection of faulty processing steps as in the first and the second related art cannot be made.

Thus, the semiconductor devices which have been judged to be non-defective in the wafer state and then sealed in packages and assembled may still contain a number of semiconductor devices which will be judged to be faulty in the above-described test, so that the conventional way of evaluating processing steps which may cause failures is disadvantageous in that an accurate evaluation of processing steps cannot be made.

In other words, the amount of data needed in the actual analysis, such as the data about semiconductors to be used in the evaluation of the processing step which may have caused failures, cannot be provided solely by the results of the test made in the wafer state.

In order to solve the above-described problems, Japanese Unexamined Patent Application, First Publication, No. Hei 04-288811 (hereinafter referred to as "third related art") discloses a method of obtaining information about the wafer or the like of a semiconductor device which has become faulty in the market, in which information about a wafer and the chip positions of semiconductor devices on the wafer are inscribed in a chip surface of each semiconductor device as data in the form of a pattern specific to the chip during a stage of processing the wafer.

However, when a semiconductor device is judged to be faulty after assembling in a package in the method of the third related art, it is necessary to remove the resin sealing the package, read the information about the wafer and so on by checking the pattern data one at a time using a microscope and by so doing produce the distribution of the semiconductor devices, which have been judged to be faulty, on the wafer.

As described above, the above method of determining positions of chips on a wafer requires that resin sealing each package of all the semiconductor devices to be analyzed be removed and is thus disadvantageous in that it consumes a great deal of time.

Furthermore, in the above method of determining positions of chips on a wafer, since the analyzer has to read the pattern data on the chip one at a time with a microscope, it will take a lot of time to read the pattern data and it may be quite probable that errors occur in the reading of the pattern data.

In addition, once the resin of the package has been removed, the surface of the semiconductor device may be corroded by the resin removing solution, or a bonding wire connecting the semiconductor device to an external terminal may be disconnected, so that it will become impossible in practice to perform an electrical test of the assembly with the result that it is no longer possible to check which characteristics have become faulty.

Japanese Unexamined Patent Application, First Publication, No. Hei 11-45839 (hereinafter referred to as "fourth related art") discloses a method in which a number of semiconductor chip areas each having predetermined circuit functions are formed in a predetermined wafer, whereafter information of position of each chip on the wafer is given to a memory element provided in a respective chip areas before the chips are separated from each other, thereby enabling the history of the manufacturing processes or the manufacturing data of each semiconductor chip to be easily associated with its characteristic data, as a result of which the yield rate of semiconductor products after the chip mounting can easily be improved as compared to the conventional method.

In the method of the fourth related art, an analysis of failures can be completed in a short period of time by knowing what manufacturing process history and what characteristic data in a wafer state the semiconductor device which has become faulty after assembly has. However, the document of the fourth related art does not contain any description suggesting procedures for the failure analysis, and this fourth related art is not arranged so that the first and the second related art is applied thereto.

Even when results of the test after assembly are associated with the position information of the wafer, it will not give enough data to allow an evaluation of the processing step which may have caused failures. More specifically, since the number of faulty assemblies is low as compared to the number of failures in the wafer stage, even when the distribution of failures is described in relation to the wafer positions, the data necessary for the analysis used in determining to which failure distribution pattern it corresponds may not be obtained, leading to a misleading failure distribution pattern.

Furthermore, in the fourth related art the position information of the wafer has to be provided in addition to the original function of the semiconductor device, as a result of which the chip size will be increased and efforts to reduce costs will be hampered.

SUMMARY OF THE INVENTION

The present invention was made in response to the above-described circumstances and has an object to provide a semiconductor device manufacturing system in which chip position information of semiconductor devices on a wafer, wafer position information and lot information can be obtained even from a semiconductor device assembled in a package; an accurate analysis of failure distribution patterns can be achieved even from a small number of failures; a processing step which is responsible for failures can be improved quickly; chip yield can be increased rapidly; and lot information, wafer information and chip position information on the wafer of a semiconductor device chip can be derived without removing resin from the package.

Another object of the present invention is to provide a method of obtaining wafer information in which chip position information of a semiconductor device on a wafer, wafer position information and lot information can be obtained by making use of the functions which the semiconductor device originally has.

A semiconductor device manufacturing system provided in accordance with a first aspect of the invention comprises a manufacturing line which manufactures a wafer with a plurality of semiconductor chips provided therein in a grid-like arrangement by a predetermined manufacturing device; a wafer tester which tests the semiconductor chips for electric characteristics thereof; a position information writing device which writes into each semiconductor chip information of chip position on the wafer; a wafer test information storage device which stores a first test result outputted from the wafer tester and the chip position information on the wafer that is associated with the first test result; a package assembling device which divides the wafer into respective ones of the semiconductor chips to produce semiconductor devices each sealed in a package; a product tester which tests each semiconductor device for its electric characteristics; a chip position detecting device which detects position information of the semiconductor device on the wafer after the semiconductor device has been sealed in a package; a product test information storage device which stores a second test result outputted from the product tester and the information of chip position on the wafer which that is detected by the chip position detecting device and is associated with the second test result; and a failure distribution mapping device which maps the distribution of failures corresponding to a wafer by combining position information of those chips determined to be faulty by the wafer tester and position information of those chips determined to be faulty by the product tester, based on the first test result, the second test result and the information of chip position; wherein a cause of failures is determined based on the distribution of failures.

A semiconductor device manufacturing system provided in accordance with a second aspect of the invention comprises a manufacturing line which manufactures a wafer with a plurality of semiconductor memories provided therein in a grid-like arrangement by a predetermined manufacturing device; a wafer tester which tests the semiconductor memories for electric characteristics thereof; a trimming device which determines a redundancy address for a redundancy memory of each semiconductor memory and blows fuses corresponding to the redundancy address; a wafer test information storage device which stores the redundancy address and position information on the wafer that is associated with the redundancy address; a package assembling device which divides the wafer into respective ones of the semiconductor memories to produce semiconductor memories each sealed in a package; a product tester which tests each semiconductor memory after the division for its electric characteristics and reads a replacement address; a position estimating device which estimates position information by comparing the read replacement address with the redundancy address; a product test information storage device which stores a second test result outputted from the product tester and the position information detected by the position estimating device that is associated with the second test result; and a failure distribution mapping device which maps the distribution of failures by associating the second test result with the position information; wherein a cause of failures is determined based on the distribution of failures.

A semiconductor device manufacturing system provided in accordance with a third aspect of the invention comprises a manufacturing line which manufactures a wafer with a plurality of semiconductor memories provided therein in a grid-like arrangement by a predetermined manufacturing device; a wafer tester which tests the semiconductor memories for electric characteristics thereof; a trimming device which determines a replacement address for a redundancy memory of each semiconductor memory and blows fuses corresponding to the replacement address; a position information storage device which stores the replacement address and position information on the wafer that is associated with the replacement address; a package assembling device which divides the wafer into respective ones of the semiconductor memories to produce semiconductor memories each sealed in a package; a product tester which tests each semiconductor memory for its electric characteristics and reads a replacement address; a position estimating device which estimates position information by comparing the read replacement address with the replacement address stored in the position information storage device; a product test information storage device which stores a first test result outputted by the wafer tester, a second test result outputted from the product tester and the position information on the wafer estimated by the position estimating device in association with one another; and a failure distribution mapping device which maps, based on the first test result, the second test result and the position information, the distribution of failures by combining position information of those semiconductor memories determined to be faulty by the wafer tester and position information of those semiconductor memories determined to be faulty by the product tester; wherein a cause of failures is determined based on the distribution of failures.

A semiconductor device manufacturing system provided in accordance with a fourth aspect of the invention is a system for estimating the location of a cause of a failure based on a test result of a manufactured semiconductor device comprising: a position information reading device which electronically reads chip data previously written in a predetermined circuit of the semiconductor device after this semiconductor device has been sealed into a package; a position information extracting device which extracts a lot number of the semiconductor device in a wafer process, a wafer number of a wafer in the lot and position information on the wafer based on the chip data; and a failure cause determining device which determines a cause of a failure which has occurred after division of the wafer into chips by combining respective test results before and after the division into a single distribution of failures.

A failure analyzing device provided in accordance with a fifth aspect of the invention displays failure distributions before and after a wafer is divided into a plurality of semiconductor memory chips in association with positions on the wafer.

A failure analyzing device provided in accordance with a sixth aspect of the invention comprises a chip position analyzing device which estimates a position of chip on a wafer; a failure distribution mapping device which maps a distribution of semiconductor chips which have become faulty; and a failure cause determining device which determines a cause of a failure from the distribution.

A method of manufacturing semiconductor devices provided in accordance with a seventh aspect of the invention comprises the step of estimating, based on a replacement address for replacing with a redundancy circuit which address is stored in each of a plurality of semiconductor memory chips into which a wafer has been divided, position information of these semiconductor memory chips on the wafer.

A method of manufacturing semiconductor devices in accordance with an eighth aspect of the invention comprises a wafer step which forms semiconductor devices in a wafer through a plurality of processing steps; a wafer test step which tests the semiconductor devices in a wafer state; an assembling step which cuts the wafer into chips of the semiconductor devices and seals only those of the chips which have passed the test respectively into packages; an assembly test step which tests the chips in a packaged state and which selects non-defective chips; a chip data reading step which electronically reads chip data previously stored in a predetermined circuit of each of those semiconductor devices which have been determined as faulty in the assembly test step; and a position information extracting step which extracts, based on the chip data, position information which comprises a lot number of the relevant semiconductor device in the wafer step, a wafer number of the relevant wafer in this lot and coordinates of the relevant chip in this wafer.

Thus, according to the present invention, since the position information of a chip of the assembly which is determined to be faulty is analyzed based on the chip data held in that chip, a malfunction of a manufacturing device or a processing step which may cause failures in the semiconductor devices in the wafer process can be identified quickly. Furthermore, the cause of a failure can be determined accurately from the information giving the position of wafer in a lot and the position of a chip on the wafer, so that an abnormal manufacturing device or processing step can be corrected quickly and the yield of chips can be improved rapidly. Furthermore, a pattern of distribution of failures can be obtained by electrically reading chip data of a semiconductor device with an LSI tester or the like without removing resin sealing the package, and by associating the chip data thus read with the registered lot information, wafer information and position information of the chip on the wafer. Therefore, the evaluation of a malfunctioning manufacturing device or faulty processing step in the wafer process can be made in a short period of time with a great number of semiconductor devices being used for the analysis. As a result, stable production of semiconductor devices becomes possible.

BRIEF DESCRIPTION OF THE DRAWINGS

FIG. 4 is an illustration showing a preferred embodiment of a structure of the manufacturing history information file 21 in FIG. 1;

FIG. 5 is an illustration showing a preferred embodiment of a structure of the wafer test information file 23 in FIG. 1;

FIG. 7 is an illustration showing a preferred embodiment of a structure of the assembly test information file 28 in FIG. 1;

FIG. 8 is a detailed flow chart showing the failure distribution mapping step SA24 and the failure cause determining step SA25 in FIG. 2;

FIG. 9 is an illustration showing some distribution patterns of faulty chips which is stored in the failure distribution database 35 in FIG. 1;

FIG. 10 is an illustration showing some distribution patterns of faulty chips which is stored in the failure distribution database 35 in FIG. 1;

FIG. 12 is an illustration showing a format for fuse addresses by which the replacement address decision device 2 according to the invention indicates positions of blown fuses;

FIG. 14 is an illustration showing the structure of a table format file in which fuse start numbers are described in the order of redundancy word lines;

FIG. 15 is an illustration showing the structure of an intermediate file which the replacement address decision device 2 outputs;

FIG. 16 is an illustration showing a format for the redundancy address table which the replacement address decision device 2 outputs;

FIG. 19 is an illustration showing a structure of the replacement address information file 43 which the replacement address reading device 41 outputs;

FIG. 20 is an illustration showing a structure of the assembly test information file 28 the assembly tester 27 outputs;

DETAILED DESCRIPTION OF THE PREFERRED EMBODIMENTS

First Embodiment

Figure 1:
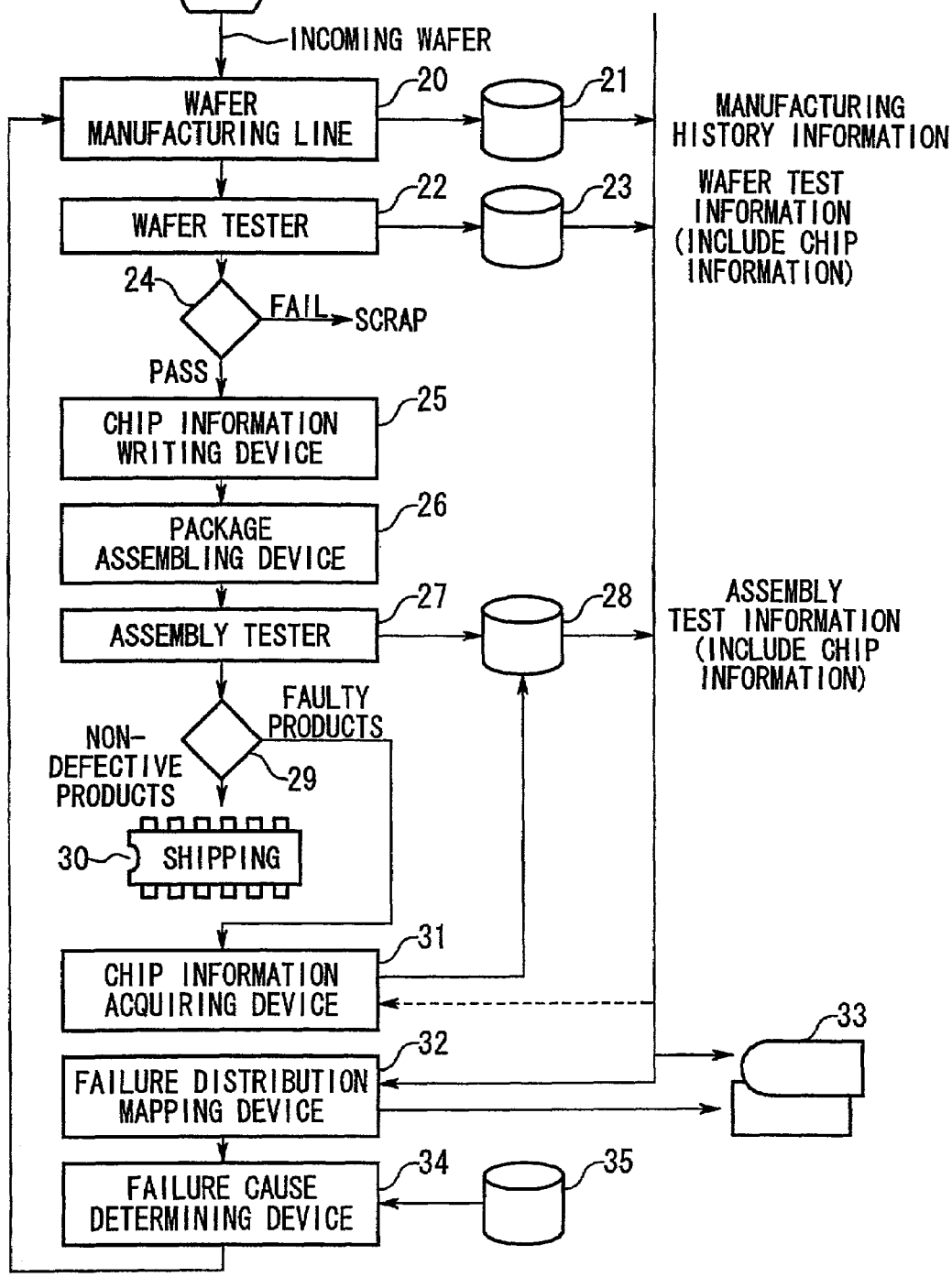
FIG. 1 is a block diagram showing the structure of a semiconductor device manufacturing system provided in accordance with a first embodiment of the invention.
Figure 2:
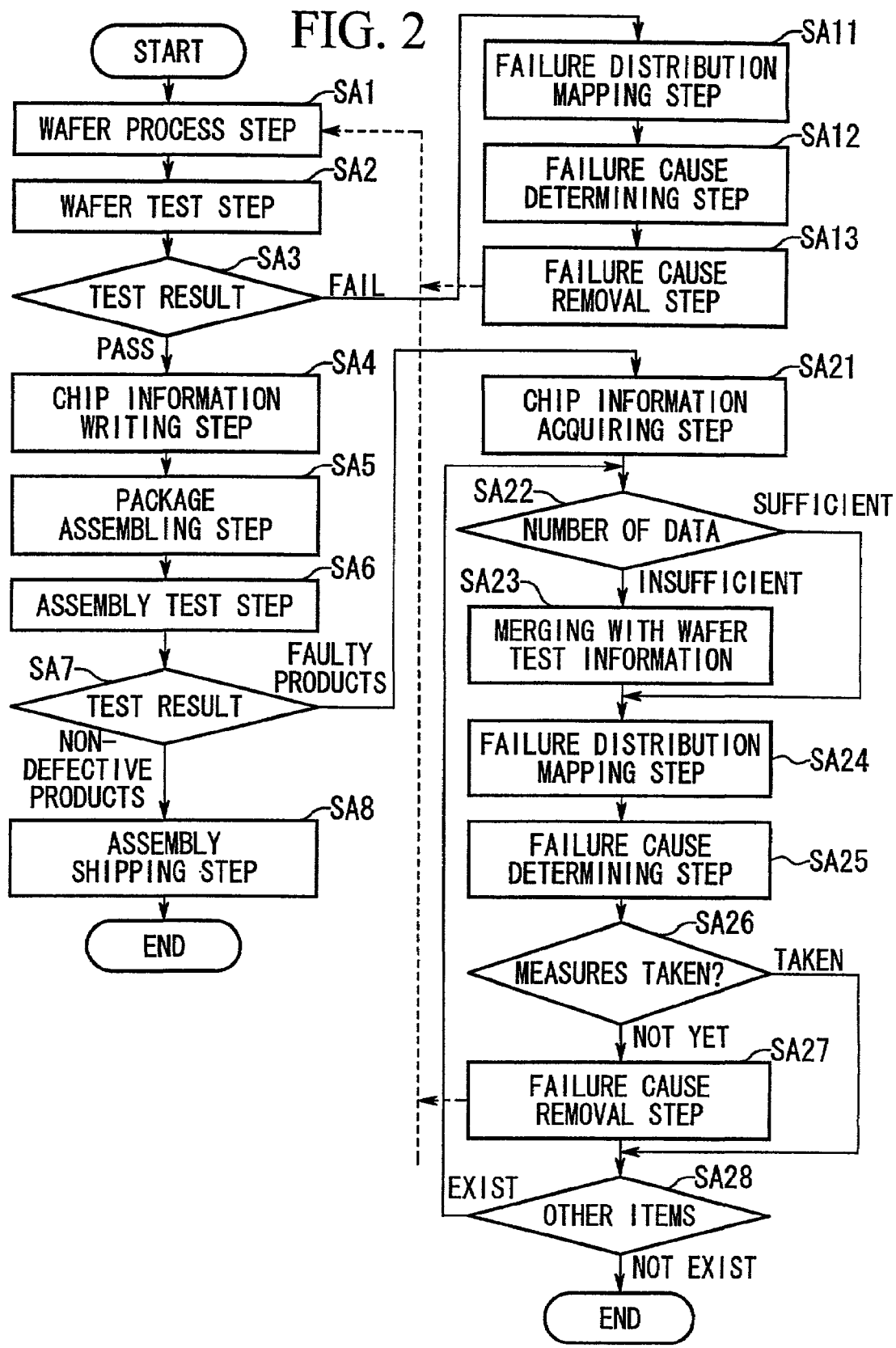
FIG. 2 is a flow chart showing the operation of the semiconductor device manufacturing system according to the first embodiment of the invention.

FIG. 1 is an illustration showing the structure of a semiconductor device manufacturing system in accordance with a first embodiment of the invention, and FIG. 2 is a flow chart which explains the operation of the semiconductor device manufacturing system.

In FIG. 1, a wafer manufacturing line 20 is constituted by manufacturing devices for performing various semiconductor processes. In a wafer process step SA1 of FIG. 2, transistor elements and wirings are formed in the surface of a wafer 100 to fabricate a semiconductor device. Usually, twenty to fifty sheets of wafer 100 are placed in a carrier and fed as one processing unit (hereinafter referred to as "a lot") to the wafer manufacturing line 20 to thereby subject them to predetermined wafer processes in predetermined manufacturing devices. Each lot is given a predetermined wafer processing lot number (hereinafter referred to as "a lot number" unless specified otherwise).

The given lot number is indicated on the carrier and recorded in a manufacturing history information file 21. In this manufacturing history information file 21, product names of semiconductor devices to be manufactured, lot numbers, numbers of wafers to be processed, names of processing steps in which these wafers are processed, times (manufacturing dates and hours) of the processing steps, numbers of devices used in the processing steps (machine numbers), manufacturing conditions of the processing steps, numbers of specifications and so on are stored as shown in FIG. 4. Here, in the manufacturing history information file 21, a wafer test information file 23 which will be described later and an assembly test information file 28 which will be described later, a line of information is called "a record".

Figure 3:
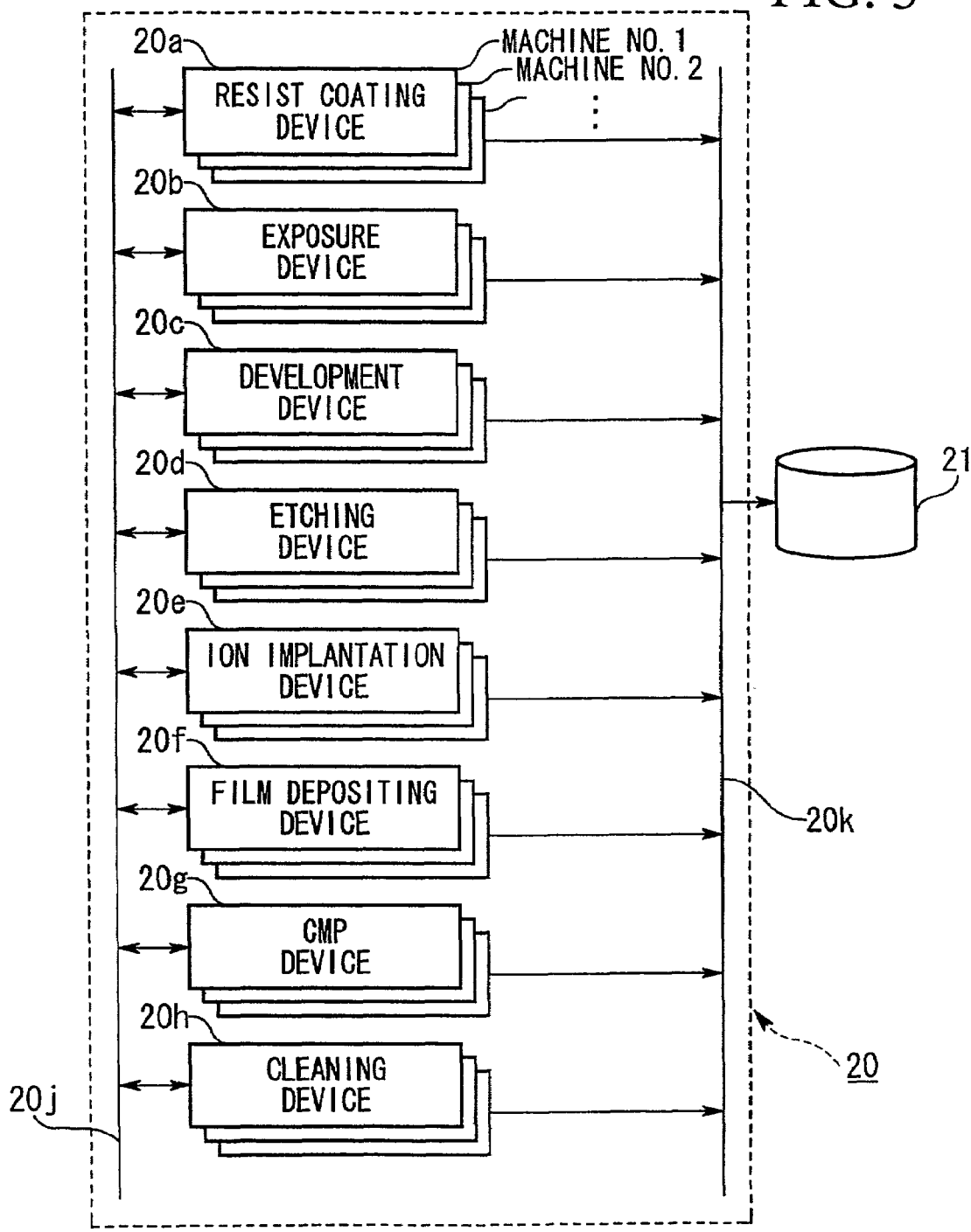
FIG. 3 is a diagrammatic illustration showing a specific structure of the wafer manufacturing line 20 in FIG. 1.

FIG. 3 shows the specific structure of the wafer manufacturing line 20. The wafer manufacturing line 20 is constituted by a resist coating device 20a, an exposure device 20b, a development device 20c, an etching device 20d, an ion implantation device 20e, a film depositing device 20f, a CMP (a chemical mechanical polishing) device 20g, a cleaning device 20h and so on. In many cases, a plurality of devices of the same type are installed for each of the manufacturing devices 20a to 20h in order to improve the productivity of semiconductor devices, wherein each of the plurality of devices is given its own machine number (No. 1, No. 2, . . . ).

The fed wafers 100 are transported through the manufacturing devices 20a to 20h by a transporting device 20j so that each wafer is processed in the wafer process step SA1 in a predetermined order. The manufacturing history in this step is stored through a communication line 20k in the manufacturing history information file 21.

Referring back to FIG. 1, a plurality of semiconductor devices have been arranged in a grid form in the surface of the wafer 100 produced by the wafer manufacturing line 20. Hereinafter, a semiconductor device before assembly into a package is referred to as "a semiconductor chip" or simply as "a chip". Each wafer formed with semiconductor chips is tested with respect to electric characteristics by a wafer tester 22. In the method used for this test, a probe is brought into contact with each input/output pad formed on each semiconductor chip to transmit a predetermined test signal thereto, and it is then determined whether its output is within a predetermined standard (PASS) or out of the standard (FAIL).

Each semiconductor chip is given coordinates on the wafer or a serial number which is called a chip number. The results of the test performed with the wafer tester 22 in a wafer test step SA2 (FIG. 2) are stored with the corresponding chip numbers in the wafer test information file 23. The wafer test information file 23 stores chip information and test information as shown in FIG. 5, wherein the chip information includes product names, lot numbers, wafer numbers and chip numbers while the test information includes test items, test dates and times, numbers of wafer testers 22 used (test machine numbers), test conditions or specification numbers, test results and overall determination results (PASS/FAIL).

Those chips which have been judged by the wafer tester 22 to have failed in step SA3 are marked, for example, by a selecting device 24 and scrapped in a subsequent process. When the test of all the wafers 100 has been completed, the processing proceeds to a failure distribution mapping step SA11, a failure cause determining step SA12 and a failure cause removal step SA13. These steps are the same as those in the first related art.

The chip number or the like is written by a chip information writing device 25 into each chip which has been judged by the wafer tester 22 to have passed in the step SA3 (see step SA4 in FIG. 2). Each chip is formed with a chip information memory circuit shown in FIG. 6A or FIG. 6B, wherein FIG. 6A shows an example which employs non-volatile memory elements EP1 to EPn while FIG. 6B shows another example which employs fuse elements FP1 to FPn.

Figure 6A:
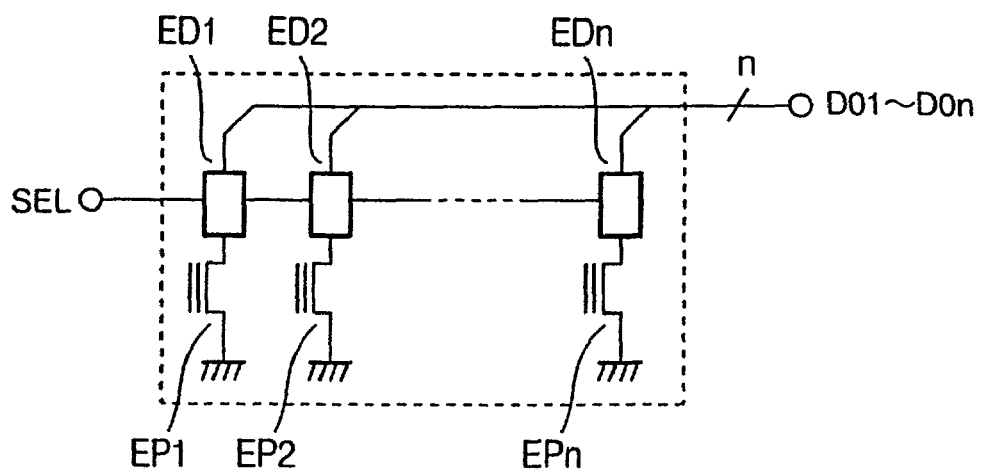
FIG. 6A is a diagrammatic illustration showing a first structure of the chip information memory circuit formed in a wafer in the semiconductor device manufacturing system according to the first embodiment.

The chip information memory circuit shown in FIG. 6A is constituted by the non-volatile memory elements EP1 to EPn and read/write circuits ED1 to EDn. When a selection signal SEL is activated, the read/write circuits ED1 to EDn are brought into operation. In write mode, chip information can be written into the non-volatile memory elements EP1 to EPn by applying predetermined signals to a data bus DO1 to DOn by means of a probe or the like. In a read mode, the chip information stored in the non-volatile memory elements EP1 to EPn is read through the read/write circuits ED1 to EDn onto the data bus DO1 to DOn.

Figure 6B:
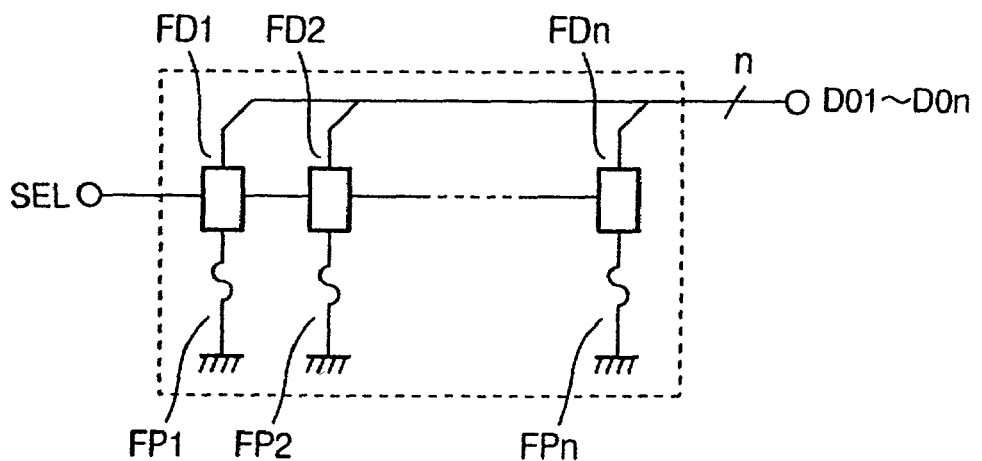
FIG. 6B is a diagrammatic illustration showing a second structure of the chip information memory circuit formed in a wafer in the semiconductor device manufacturing system according to the first embodiment.

The chip information memory circuit shown in FIG. 6B is constituted by the fuse elements FP1 to FPn and read/write circuits FD1 to FDn. In a write mode, chip information can be written by blowing/not blowing the fuse elements by a laser trimming device 3 (refer to FIG. 11). In read mode, the selection signal SEL is activated whereupon the read/write circuits FD1 to FDn are brought into operation with the result that the chip information stored by the fuse elements FP1 to FPn is read through the read/write circuits FD1 to FDn onto the data bus DO1 to DOn.

Referring back to FIGS. 1 and 2, each wafer 100 whose processing in the above steps has been completed is cut into a plurality of chips by a dicing device provided in a package assembling device 26. Each of those chips which have been judged by the wafer tester 22 to have passed is mounted on a lead frame and sealed with a resin or the like by the package assembling device 26 (step SA5 in FIG. 2). Hereinafter, a semiconductor device which has been sealed with a resin is called "an assembly". Each assembly is given an assembly lot number on the basis of the processing unit in the assembling step. In addition, each package is marked at it surface with a manufacturing lot number determined by the combination of a wafer processing lot number and an assembly lot number.

Each assembly is subjected, by an assembly tester 27, to a direct current characteristic test (DC test), an operation test (AC test), an accelerated test (life test) and so on (step SA6 in FIG. 2). The DC test is a test for determining whether each terminal of the assembly meets predetermined DC requirements and is performed in respect of circuit currents, high level/low level output voltages, high level/low level output currents and so forth. The DC test can be accomplished in a shorter period of time as compared to the AC test and the life test, and is therefore performed prior to the latter two tests. As for those assemblies which have been determined to be faulty in the DC test, the AC test and the life test can be omitted.

In the AC test, a predetermined pattern of signals is applied to an assembly and it is determined whether an expected pattern of signals is outputted therefrom, thereby confirming that the assembly fulfills desired functions.

The accelerated test is performed to eliminate initial failures of assemblies and includes, for instance, a bias test in which a high supply voltage is applied for a predetermined time period, a high-temperature/low-temperature storage test and a Pressure Cooker test.

The results of the test performed with the assembly tester 27 are stored in the assembly test information file 28. The assembly test information file 28 is composed of assembly chip information and assembly test information as shown in FIG. 7, wherein the assembly chip information includes product names, lot numbers, assembly lot numbers, wafer numbers, chip numbers and sample numbers, while for the assembly test information test items, test dates and times, numbers of assembly testers 27 used in the test (test machine numbers), test conditions or numbers of their specifications, test results and overall determination results about non-defective products (PASS)/faulty products (FAIL) are stored. At this stage, however, the chip number and the sample number are not stored.

The assemblies which have been determined to be non-defective by the assembly tester 27 in the step SA7 pass through a selection device 29 and are shipped as products 30 (step SA8 of FIG. 2). Those assemblies which have been determined as faulty are given sample numbers by the selection device 29, which sample numbers are stored in a predetermined record of the assembly test information file 28. As to each faulty device, its chip number which has been written by the chip information writing device 25 is read by a chip information acquiring device 31 (step SA21 of FIG. 2). This chip number is stored in the record in the assembly test information file 28 which corresponds to the same number (see FIG. 7).

When it is determined in step SA22 that the number of data is insufficient, i.e., when the number of points to be indicated to map a distribution of failures is low, it will become impossible to carry out a pattern matching operation with the failure distribution database 35 correctly in the next step SA25, as a result of which an incorrect evaluation of what caused the failures may be made. To avoid this, it is desirable to perform merging with the wafer test information file to represent a distribution of failures (step SA23 of FIG. 2).

A failure distribution mapping device 32 retrieves those records which correspond to the determination results of "FAIL" from the wafer test information file 23 and the assembly test information file 28 and performs the required operations on the records thereby to display the failure distribution on a display device 33 which corresponds to the positions of their chip numbers on a wafer, and also to display such distributions cumulatively for one lot, to display such failure distributions separately for each wafer number and to display a change in rate of occurrence of failures for different lot numbers (step SA24 of FIG. 2).

A failure distribution database 35 has stored therein distribution patterns of failures and their corresponding causes and the manufacturing devices and processing steps causing the failures.

A failure cause determining device 34 compares the distribution of failures as obtained by the failure distribution mapping device 32 with the failure distributions stored in the failure distribution database 35 to thereby derive the most likely cause of failures (step SA25 of FIG. 2).

Figure 27:
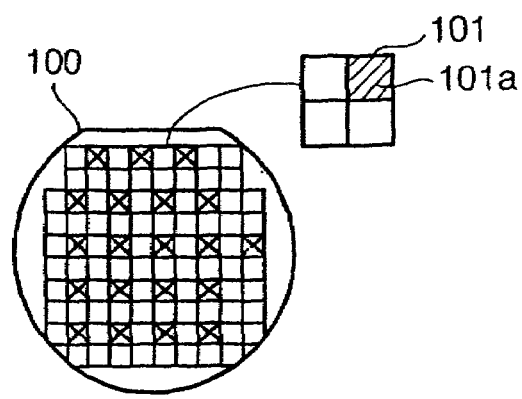
FIG. 27 is a diagrammatic illustration showing the surface of a wafer in which positions of those semiconductor devices which have been determined as faulty are indicated.

The line manager of the wafer manufacturing line 20 examines the manufacturing device and/or processing step which have been judged to be the cause of failures based on the above derivation. If this cause of failure corresponds to that for which a measure has already been taken in the wafer stage in the failure cause removal step SA13, the processing proceeds from step SA26 to step SA28. If it is determined in step SA26 that no measure has been taken, the position of the cause of failures in the wafer manufacturing line 20 and the wafer process step SA1 can be located and the cause removed (step SA27 of FIG. 27).

In step SA28, if failures (FAIL) still remain to be analyzed with respect to other test items, the processing returns to the step SA22 to repeat the steps SA22 to SA27 to map failure distributions with respect to the other test items. If no defect (FAIL) remains to be analyzed for other test items, the processing for the analysis of failures will be terminated.

The processing in the failure distribution mapping step SA24 and the failure cause determining step SA25 will now be described in more detail with reference to the flow chart shown in FIG. 8.

In step SA24a, the failure distribution mapping device 32 retrieves the test information and the chip information from the assembly test information file 28 and/or the wafer test information file 23.

In step SA24b, the failure distribution mapping device 32 classifies the test items for which failures (FAIL) have been detected into groups having different lot numbers and different wafer numbers. When deriving a relation between the wafer number and the number of failures that have occurred with respect to a predetermined test item, a graph such as those shown as patterns K and L in FIG. 10 can be displayed. This graph can be displayed only for a predetermined lot number or can be displayed as a result of an accumulation of the numbers of failures in the respective lots. It will become possible to perform an analysis based on this result to determine whether failures that occurred in a certain lot have a dependency on the positions of wafers or on the order of processes.

In step SA24c, the failure distribution mapping device 32 rearranges the test items, for which failures (FAIL) have been detected in each one of the wafers of a predetermined lot, for each test item, for each wafer number and for each chip number.

When deriving, for each test item, the relation between the position on a wafer corresponding to the chip number and the faulty item and the relation between that position and the number of failures that occurred, the faulty positions can be displayed corresponding to a wafer as shown as patterns A to D in FIG. 9. Each faulty position can be displayed only for a specific wafer number or can be displayed as a result of an accumulation of the numbers of failures that occurred in the respective wafers or in the respective lots. This result enables an analysis for determining whether failures occurred in a specific wafer or in a specific lot depend on the chip positions or not.

In step SA24d, the failure distribution mapping device 32 classifies, for predetermined test items, failures (FAIL) in terms of number into groups each having the same lot number, the same wafer number or the same chip number.

By deriving the chronological variation of the number of failures that occurred for a predetermined test item, the progress of the number of failures that occurred can be displayed in a temporal relationship, for example, with the manufacturing dates and times as shown as a pattern P in FIG. 10. The numbers of failures that occurred can be displayed not only for a specific lot number, wafer number or chip number but also as results of accumulations of the numbers of failures in respective chips, wafers or lots. By grasping the chronological variation of the number of failures according to this analysis, it will become possible to perform maintenance work on the wafer manufacturing line 20 and the wafer process step SA1 before replaceable parts of the devices fail and the processing liquid is rendered unusable. Thus, the occurrence of a multitude of failures can be prevented and a stable supply of semiconductor devices can be achieved.

In step SA25a, the failure cause determining device 34 compares the distribution of failures as obtained by the failure distribution mapping device 32 with the failure distribution patterns A, B, . . . , P, . . . stored in the failure distribution database 35 to thereby select the closest failure distribution pattern. In the failure distribution database 35, as shown in FIG. 9 and FIG. 10, the failure distribution patterns A, B, . . . , P, . . . have been stored together with information about their corresponding causes, manufacturing devices and processing steps to be improved and so on.

When the selected pattern of failure distributions is similar to the pattern A, a determination is made such that a device SA25b for spin-coating liquid such as for a resist and SOG (Spin on Glass) may be the cause of the failures. As for the other failure distribution patterns B, . . . , P, . . . , causes of failures SA25c to SA25h and so on can be estimated.

If the product has a simple structure, such as an acceleration sensor, the number of manufacturing devices and processing steps is low, so that causes of failures can be relatively easily determined by knowing the manufacturing process history and the characteristic data in the wafer stage of the assemblies which have become faulty as in the fourth related art. However, in the case of a semiconductor device for which there are several hundreds of manufacturing devices and several thousands of processing steps involved, even if the manufacturing process history and the characteristic data in the wafer stage can be known, a substantial amount of time will be needed until the causes of failures can be located.

In contrast, according to the present embodiment, since the cause of failures can be estimated based on the distribution of failures, the cause of failures can be located within a short time. In the case where it is not possible to determine to which distribution of failures it corresponds because the number of failures is too low, it will become possible to make a determination without error through pattern matching with the failure distributions by merging with the wafer test information file.

The measurement of a charge-retaining characteristic of a capacitive element formed in a DRAM chip will take a substantial amount of time, so that it becomes inefficient to test such an element in the wafer stage. For such a reason, a plurality of assemblies are inserted into a testing board and are simultaneously tested to thereby shorten the test time for each assembly. For a test item of the above-described type for which detection of failures (FAIL) is not performed in a wafer stage, an analysis cannot be made in the first related art, so that it has been impossible to estimate easily in a short time for that test item which manufacturing device or process step has caused failures.

According to the above-described embodiment of the invention, since the distribution of failures can be displayed according to the chip position on a wafer and/or the wafer position based on the chip information, it becomes possible to estimate easily in a short time the manufacturing device or process step which has caused failures even from the test results of assemblies.

Second Embodiment

Figure 11:
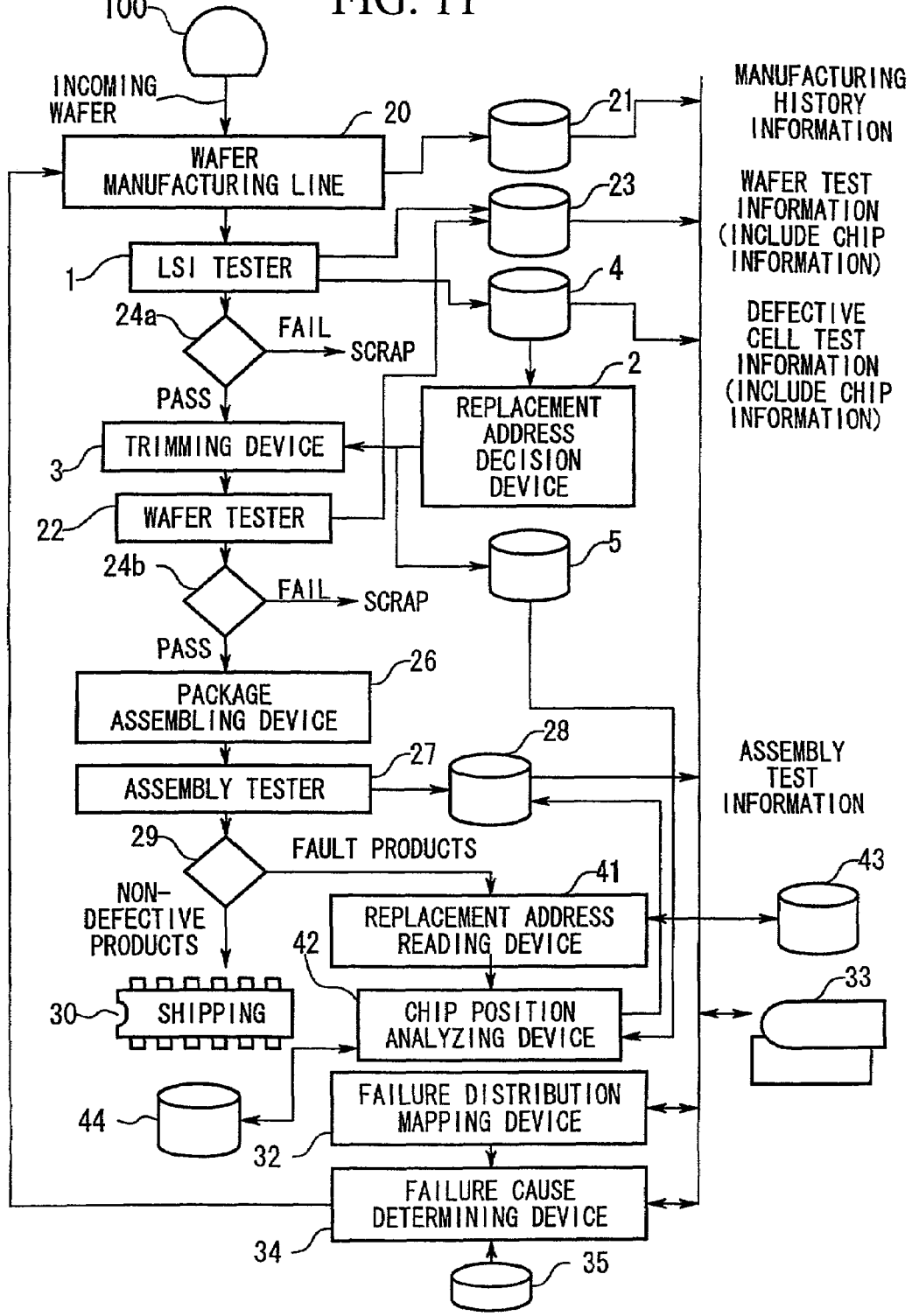
FIG. 11 is a block diagram showing a preferred embodiment of a structure of the semiconductor device manufacturing system according to a second embodiment of the invention.

FIG. 11 shows the structure of a semiconductor device manufacturing system provided in accordance with a second embodiment of the invention, wherein its elements corresponding to those in the first embodiment are designated by like reference numerals and their description will be omitted.

In the following description, it will be assumed that the semiconductor device to be manufactured is a memory such as a DRAM (dynamic random access memory) which comprises a plurality of memory cells and redundancy circuits which can replace memory cells having defectives (hereinafter referred to as "defective cell").

A wafer 100 is fed to a wafer manufacturing line 20 in which the wafer is subjected to predetermined processing steps, as a result of which a plurality of semiconductor memories are formed in the wafer surface.

Herein, the wafer manufacturing line 20 means a series of processing steps up to the processing step for cutting the wafer into chips and includes all the processing steps for forming transistors in a surface of the wafer such as an ion implantation step (impurities injection step), a diffusion step, a thin film deposition step, a resist coating step, an exposure step, an etching step and a back grind step.

When the steps of the wafer manufacturing line have been completed at step 20, an LSI tester 1 comprising a CPU, a storage section and a memory performs an operation test (AC test) and a direct-current characteristic test (DC test) with respect to semiconductor devices in the form of chips in the wafer state (after the wafer manufacturing process) in accordance with a test program stored in the storage section.

Furthermore, the LSI tester 1 tests the semiconductor memories in the wafer state as in the related art and stores defective cell test information (data in the bitmap form) representing defective cells in a memory cell array (chip) for each chip in a defective cell test information file 4.

A replacement address decision device 2 carries out an analysis for a combination of a word line and a bit line based on the bitmap data received for each wafer in order to efficiently remedy those bits failed in each chip on the wafer.

Then, the replacement address decision device 2 determines, based on addresses of the word lines and addresses of the bit lines as obtained from the results of the above analysis, fuse addresses corresponding respectively to the word line and the bit line with reference to a fuse address file having a format shown in FIG. 12 for each lot of the wafer manufacturing process in order to replace the word line and the bit line with a redundancy word line and a redundancy bit line.

Herein, an address for substitution which is calculated based on the bitmap data supplied to a trimming device 3 in the wafer stage is defined as a "redundancy address", while a "redundancy address" derived from assemblies, which will be described later, is defined as a "replacement address".

The replacement address decision device 2 determines, based on the defective cell test information of defective cells which is received from the defective cell test information file 4, whether the defective cells are to be replaced by means of the redundancy word line or the redundancy bit line in the redundancy circuit. More specifically, the replacement address decision device 2 performs an analysis for each of the successive chips to determine which one of the redundancy word lines and redundancy bit lines enables the faulty bits to be remedied more efficiently (i.e., with fewer redundancy bit and word lines to be replaced). The determination of redundancy addresses is performed for every chip on a wafer and for every wafer in a lot.

The memory cells with which replacement can be made are constituted by those in a redundancy memory cell area which are connected to redundancy word lines and arranged in the direction of the word lines and those in a redundancy memory cell area which are connected to redundancy bit lines and arranged in the direction of bit lines. A plurality of such redundancy memory cell areas exist.

In the case where three of a plurality of defective cells lie on one word line, for example, if that word line is replaced with a redundancy word line it will be sufficient to replace only a single line, but if the bit lines are replaced with redundancy bit lines three lines must be replaced. Thus, the replacement of the word line with a redundancy word line is more efficient in terms of the number of lines used. When replacing a plurality of defective cells in the bitmap with redundancy memory cells, the replacement address decision device 2 determines combinations of redundancy word lines and redundancy bit lines by which the defective cells can be replaced efficiently as described above.

Furthermore, the replacement address decision device 2 generates such a fuse address which causes the redundancy bit line and the redundancy word line which will replace the bit line and the word line selected as a result of the above analysis, respectively, to have an address which is the same as that of the corresponding bit line and word line.

More specifically, the redundancy word lines and the redundancy bit lines each has an address setting circuit which comprises a plurality of fuses for setting redundancy addresses as will be described in more detail later. By blowing predetermined fuses corresponding to a desired address, a redundancy address can be set arbitrarily.

The replacement address decision device 2 generates a fuse address, which specifies which fuses are to be blown, based on data of the address of the word line and the bit line to be replaced and output the fuse address thus generated to a trimming device 3. In addition, the replacement address decision device 2 stores this fuse address in a fuse information file 5.

The replacement address decision device 2 outputs this fuse address file to the trimming device 3 and stores it in the fuse information file 5.

A chip position analyzing device 42 generates the table format data of FIG. 14 which represents classification of the fuses in the redundancy circuits, i.e., which fuse numbers those fuses constituting each group of fuses which sets an address of redundancy word and bit lines have. The chip position analyzing device 42 then stores the data in a redundancy address table file 44 in association with the above-described fuse address file.

The trimming device 3 then successively blows, by means of a laser, fuses in the redundancy circuit in each chip of a wafer for each wafer in a lot in the wafer process step, based on the received data stored in the fuse address file.

In this case, as described above, the replacement address decision device 2 outputs the fuse address file of a predetermined lot which has been produced based on the bitmap obtained as a result of the test by the LSI tester 1 to the trimming device 3 shown in FIG. 11 and also stores this fuse address file in the fuse information file 5.

The trimming device 3 blows with the laser corresponding fuses in each chip in each wafer based on the received fuse address file.

Based on the fuse address file, the trimming device 3 blows with the laser, for each wafer, fuses of the chips of the semiconductor devices on the wafer to thereby replace the word lines and the bit lines with the redundancy word lines and the redundancy bit lines.

After the above replacement of the word and bit lines with the redundancy word and bit lines has been completed, each wafer is again subjected with the wafer tester 22 to a test with respect to its semiconductor devices in order to confirm that the replacement with the redundancy word and bit lines has been done as scheduled. The wafer tester 22 may be the same as the LSI tester 1. Those chips which have been determined as faulty (FAIL) in this test are marked and will be discarded in a later step.

Those chips which have been determined as passing (PASS) are cut/separated by a cutter into chip units, sealed into packages with a plastic resin on a chip unit basis and assembled by a package assembling device 26.

An assembly tester 27 subjects these assembled semiconductor devices to tests which could not have been done in the wafer stage. These tests include, for example, a high-speed operation test, a breakdown test in which a high voltage is applied, an accelerated (life) test which is carried out in a normal/low temperature/high temperature atmosphere and requires a long period of time and other tests which will interfere with other semiconductor device chips in the wafer state through the wafer substrate.

In the above tests after assembly, semiconductor devices which are determined as faulty in these subsequent tests with respect to the additional test items or their assembled conditions are detected by a selecting device 29 from among the semiconductor devices which have been determined as non-defective (PASS) with respect to the test items in the wafer state.

At this stage, the packages of those assemblies which have been determined as faulty are marked (stamped) with sample numbers which are unique in the relevant lot. These sample numbers are stored in an assembly test information file 28.

Thus, the wafer tester 22 tests each chip on a wafer after the laser processing for blowing the fuses for redundancy with the trimming device 3 is completed.

Those chips for which bit failures are again detected as a result of the above test are scrapped as irreparably faulty chips in the next step.

Thus, those semiconductor device chips which have been remedied with the redundancy circuits are sealed into packages and assembled. In this case, the packages are marked on their surfaces with the assembly lot number, the product name and the like.

Then, these assemblies are subjected with the assembly tester 27 to tests which could not have been done in the wafer stage, namely a high-speed operation test, a breakdown test in which a high voltage is applied, an environmental test which is carried out in a normal/low temperature/high temperature atmosphere, and other tests which will interfere with other chips through the wafer substrate.

In this test after assembly, semiconductor devices which are determined as faulty with respect to the additional test items are detected from among the semiconductor devices which have been determined as non-defective (PASS) in the tests in the wafer state.

Next, the replacement addresses are extracted from the faulty assemblies by means of a replacement address reading device 41 to create for each chip a replacement address information file 43 shown in FIG. 19.

Then, an analysis of the failures is performed in order to improve the manufacturing yield. For this purpose, the assemblies which have been determined as faulty are used by a failure cause determining device 34 to carry out an analysis for determining which processing steps in the wafer process have caused the failures.

In this case, the failure cause determining device 34 makes use of the fact that abnormal processing steps can be identified from the wafer position information in a lot and the pattern (position information) of occurrence of failures in a wafer based on failure patterns in a failure analysis database 35 to estimate which processing steps of the wafer steps have caused the failures in the chips.

Therefore, for the above identification of abnormal processing steps, it becomes necessary to obtain the wafer position information in the lot of the semiconductor devices and the chip position information on that wafer.

Those assemblies which have been determined to have passed by the selection device 29 are shipped as products 30 of semiconductor memory.

Next, an outline of the failure analyzing steps in the manufacture of semiconductor memories will be described with reference to FIG. 11. In the manufacture of semiconductor memories, the failure analysis which will be described hereunder is made without synchronizing with the manufacturing steps.

The replacement address reading device 41 carries out a roll call (which will be described later) with respect to those assemblies which have been determined to be faulty in the test of the test items added during the test of assemblies to thereby extract the replacement addresses. In this case, in place of the replacement address reading device 41, the assembly tester 27 can be used to read the replacement addresses from the assemblies by changing the test programs in the assembly tester 27.

A chip position analyzing device 42 reads, for each assembly which has been determined as faulty in the test after assembly, data of the replacement addresses from the replacement address information file 43 and retrieves, from a redundancy address table stored in a redundancy address table file 44 shown in FIG. 11, the chip number which corresponds to a combination of replacement addresses as described in the above replacement address data.

Furthermore, the chip position analyzing device 42 stores the retrieved chip information in the assembly test information file 28 at that record (storage area) whose sample number agrees therewith.

In the assembly test information file 28 shown in FIG. 20, the relation of the sample number of each semiconductor device sealed into a package after assembly to the lot number, wafer number and chip number of each semiconductor device chip in the wafer process is indicated.

Each record in the replacement address information file 43 contains information on the sample number.

Therefore, the chip position analyzing device 42 extracts the above sample number from the record of the replacement address information file 43.

Then, the chip position analyzing device 42 writes this sample number in the assembly test information file 28 in association with the chip number which has been retrieved from the redundancy address table and corresponds to the combination of redundancy addresses of the semiconductor device having this sample number.

It is assumed here that the chip position analyzing device 42 has detected the fact that a combination of redundancy addresses {X/3, 4, A, C, D, . . . Y/1, 5, 7, 9, A, . . . } of the wafer process lot number "CB95-3030", wafer number "01" and chip number "06,31" described in the redundancy address table of the redundancy address table file 44 agrees with a combination of replacement addresses {X/3, 4, A, C, D, . . . Y/1, 5, 7, 9, A, . . . } described in the replacement address information file 43 at the record corresponding to the sample number "1".

Herein, [X/3, 4, A, C, D, . . . ] represents a combination of redundancy addresses on the word line, while [Y/1, 5, 7, 9, A, . . . ] represents a combination of redundancy addresses on the bit line.

In this case, the chip position analyzing device 42 detects the semiconductor device of the sample number "1" sealed in a package after assembly as the chip having the wafer process lot number "CB95-3030", wafer number "01" and chip number "06,31" and stores the character "1" of the sample number "1" in the assembly test information file 28 in association with the character string of the lot number "CB95-3030", wafer number "01" and chip number "06, 31".

More specifically, as shown in FIG. 20, the chip position analyzing device 42 describes in the assembly test information file 28 the character string "CB95-3030" representing the lot number in the wafer process at an area R401 as data for the item "WAFER STEP LOT NO", the character string "35er008" representing the lot number in the assembling process at an area R402 as data for the item "ASSEMBLY LOT NO", the character string of an identifier "W" and the wafer number "01" at an area R403 as data for the item "WAFER NO", the character string of the chip number "C06,31" at an area R404 as data for the item "CHIP NO", and the character "1" of the sample number of the semiconductor device after assembly at an area R505 as data for the item "SAMPLE NO".

The failure distribution mapping device 32 carries out statistical processing to facilitate an analysis based on the assembly test information file 28 of FIG. 20 to determine to which processing step in the wafer process caused the failures to each semiconductor device which has failed attributes.

Figure 21:
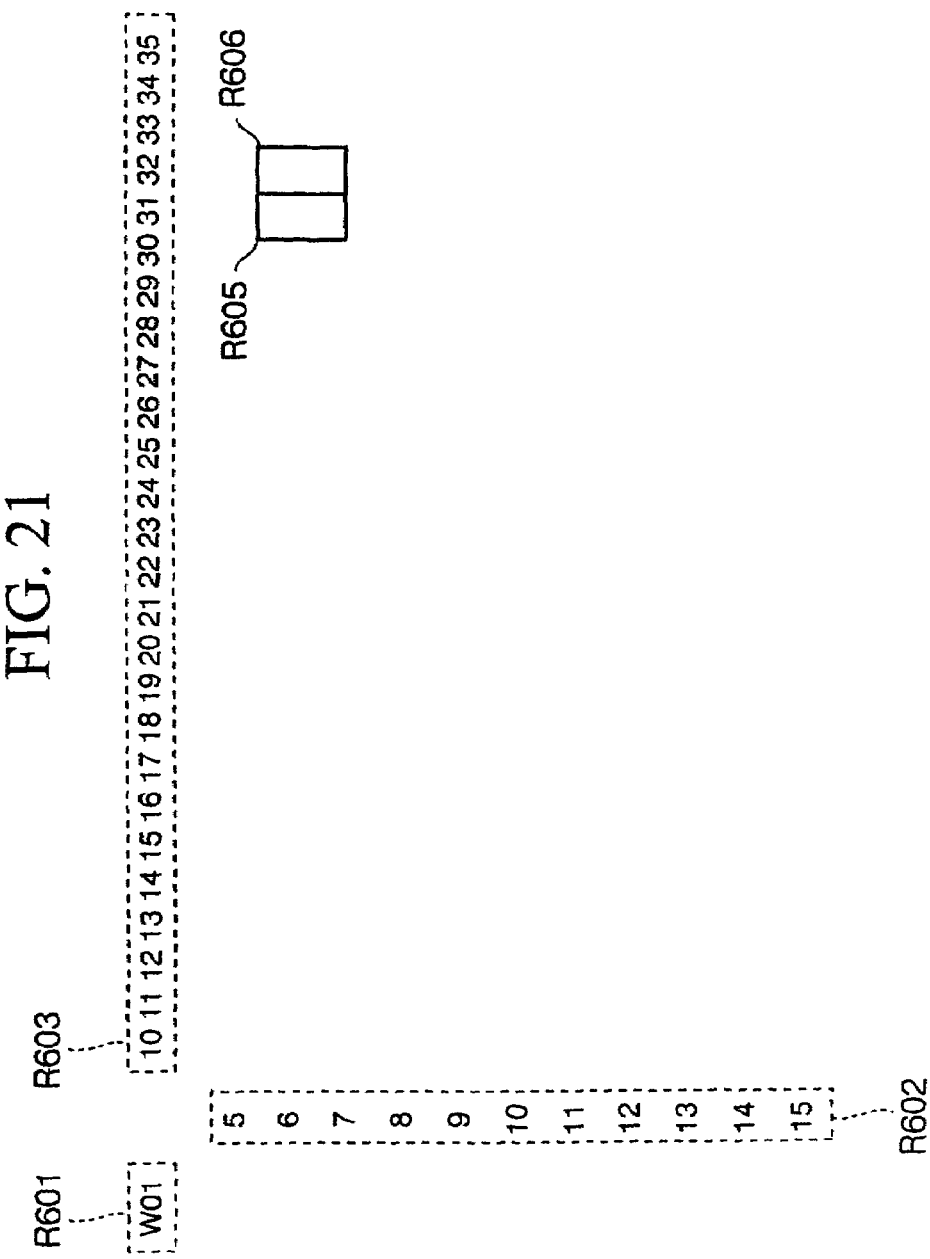
FIG. 21 is an illustration showing the structure of a failed chip distribution table which the failure distribution mapping device 32 outputs.

More specifically, the failure distribution mapping device 32 reads the chip numbers from the assembly test information file 28 of FIG. 20 for each wafer and derives a table of distribution of failed chips of FIG. 21 based on position coordinates contained in these chip numbers.

In this failed chip distribution table, a character string composed of the identifier "W" and the wafer number "01" is indicated in an area R601, a character string of "5" to "15" representing vertical chip coordinates in the wafer is described in an area R602 and a character string of "10" to "35" representing horizontal chip coordinates in the wafer is described in an area R603.

When displaying the semiconductor device of the sample number 1 which has the lot number "CB95-3030", the wafer number "01" and the chip number "06,31" on the chip distribution table of FIG. 21, since "06" of the character string of the chip number "06,31" represents the vertical coordinate of the chip and "31" represents the horizontal coordinate of the chip, the failure distribution mapping device 32 describes a mark R605 at the position of these coordinates.

In a similar manner, when displaying the semiconductor device of the sample number 2 which has the lot number "CB95-3030", the wafer number "01" and the chip number "06,32" on the chip distribution table of FIG. 21, the failure distribution mapping device 32 describes a mark R606 at a corresponding position. These marks R605 and R606 indicate failed chips. This distribution table is displayed by the failure distribution mapping device 32 on the display device 33.

Furthermore, the failure distribution mapping device 32 detects where on the wafers failed chips are concentrated by superposing the chip distribution tables, where each table has been derived for a respective one of the wafers, for each lot. There may be a case where the number of failures is too low in the derived failure distribution to identify a specific distribution pattern. In such a case, the assembly test information file 28 may be merged with the wafer test information file 23 produced with respect to the test items in the wafer stage so that a failure distribution can be derived. By doing so, the amount of information on the failure distribution patterns is increased, so that identification of the failure distribution pattern will be made easier, as a result of which the probability of an incorrect determination of the cause of any failure will be decreased.

Then, the failure cause determining device 34 compares the pattern of marks in the chip distribution tables superposed on each other for each lot with the failure patterns of wafers which have been stored in the failure distribution database 35 and are specific respectively to the processing steps which may cause the failures. Based on the comparison, the failure cause determining device 34 determines that the cause of failures exists in the processing step whose failure pattern is the closest and displays, on the display device 33, the pattern of marks of the chip distribution tables superposed on each other for each lot together with the name of the processing step obtained as a result of the above determination.

In this case, a more accurate analysis of faulty processing steps may become possible by including, in the above chip distribution table, the distribution of semiconductor devices in the wafer state on a wafer which has failed after the wafer process has been completed, and by comparing such distribution with failure patterns used in the determination of the cause of failures in the processing steps.

Formats of the files used herein will now be described one by one.

Fuse addresses which the replacement address decision device 2 outputs to the trimming device 3 has such a format as shown, for example, in FIG. 12.

A character string of a "PRODUCT NAME" described in an area R1, and a character string of an identifier "LOT NO" and a character string of a lot number "LOT NAME" are described in an area R2 as a character string of "LOT NO", "LOT NAME".

An identifier "W" and a wafer number "XX01" are described in an area R3 as a character string of an identifier "WXX01".

Following the above area, in a row of areas R4, R5, . . . , an identifier "F" and Vref fuse numbers "Y101", "Y102", . . . are described as character strings "FY101", "FY102", . . . , respectively, in the order of chips on the wafer bearing the above wafer number.

Described in an area R6 is a chip number whose character string is composed of an identifier "C" and a chip number "A001".

Following this area, row fuse numbers representing numbers of the fuses which are blown are described in a row of areas R7, R8, . . . in the order of their numbers for each chip (a series of fuse addresses for the row fuse numbers). These character strings are composed of an identifier "F" and fuse numbers "B101", "B102", . . . These row fuse numbers correspond to the fuses in the redundancy circuit for setting addresses of the redundancy word lines. In this case, the character strings are separated from each other by ";".

Similarly, column fuse (COL FUSE) numbers representing the fuses which are blown are described in a row of areas R9, R10, . . . , respectively, in the order of their numbers for each chip (a series of fuse addresses for the column fuse numbers). These character strings are composed of the identifier "F" and fuse numbers "C101", "C102", . . . The column fuse numbers correspond to the fuses in the redundancy circuit for setting addresses of the redundancy bit lines.

A character string of the identifier "C" and a chip number "A002" is described in an area R11 as a character string representing the next chip number.

After that, a chip number, row fuse numbers and column fuse numbers are described in areas R12 to R15 in the above order.

Next to the above, a character string "/E" which is an identifier indicating the end of the chip number, row fuse numbers and column fuse number of the first wafer is described in an area R16 as a termination delimiter of the wafer information.

In an area R17, a character string of the identifier "W" and wafer number "XX02" which represents the number of the next wafer is described.

Following this area, Vref fuse numbers and row fuse numbers and column fuse numbers corresponding to respective chips of the second wafer bearing the wafer number "XX02" are described in areas up to an area R25 where a character string of the termination delimiter "/E" of wafer information is shown, i.e., from an area R18 to an area R24, in a manner described above for the case of the first wafer of the number "XX01".

In a similar manner, respective fuse numbers of the wafers of the lot bearing the lot number "LOT NAME" described in the area R2 are described in succession.

Figure 13:
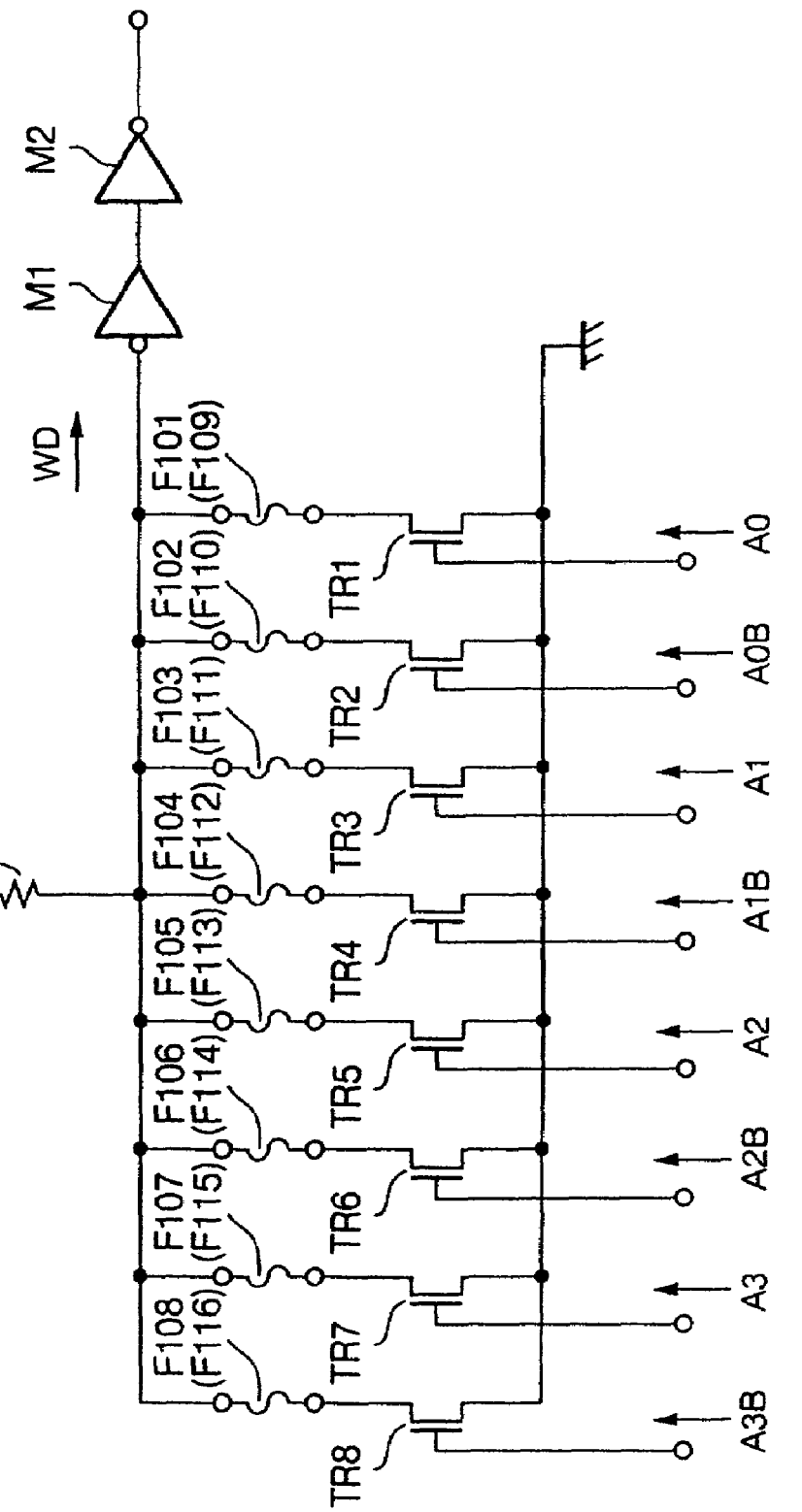
FIG. 13 is a diagrammatic illustration showing a preferred embodiment of a structure of a fuse circuit by which an address of one redundancy word line is set.

The fuse numbers referred to in the above description represent the numbers of fuses such as those shown in FIG. 13. FIG. 13 is a diagrammatic illustration showing the structure of a fuse circuit for setting an address to one redundancy word line. Usually, there are a plurality of redundancy word lines provided. For the sake of simplicity, the address signals with respect to the word line are shown to be constituted by four address signals A0 to A3. The actual number of address signals varies depending on the memory capacity and the type of memory arrangement. The fuse circuit for each redundancy bit line has a structure similar to that shown in FIG. 13.

In FIG. 13, the row fuse numbers in FIG. 12 correspond to fuses F101 to F108.

More specifically, the address signal A0 received from the outside is supplied, by a decoder not shown in the figure, to a gate of corresponding transistor from among transistors TR1 to TR8 of the n-channel MOS (Metal Oxide Semiconductor) type as complementary signals composed of the same address signal A0 and an inverted address signal A0B. For example, the address signal A0 is supplied to a gate of the transistor TR1 and the address signal A0B is supplied to a gate of the transistor TR2.

One end of the fuse F101 is connected to a drain of the transistor TR1, and the other end of the fuse F101 is connected to a power supply of a predetermined voltage through a resistor RR. Similarly, One end of the fuses F102 to F108 are connected to drains of the transistors TR2 to TR8, respectively, and the other ends of the fuses F102 to F108 are connected through the resistor RR to the power supply of the predetermined voltage.

Sources of the transistors TR1 to TR8 are grounded. A junction point between the other ends of the fuses F101 to F108 on the one end and the resistor RR is connected to an input terminal of an inverter M1. This inverter M1 serves together with another inverter M2 to perform level adjustment and waveform shaping of a word signal WD.

In the case where the replacement address decision device 2 determines based on the bitmap of the wafer No. "0001" tested by the LSI tester 1 that the word line whose address signal {A3, A2, A1, A0} is {0, 0, 1, 1} be replaced by a redundancy word line, for example, this replacement address decision device generates a fuse address from the above address signal {0, 0, 1, 1}.

More specifically, when the address signal {0, 0, 1, 1} is received, the replacement address decision device 2 selects those to be blown from the fuses F101 to F108 so that the word signal WD goes to "H" level.

When the address signal of {0, 0, 1, 1} is received, those address bits of the address signal which take the "H" level are the address bits {A3B, A2B, A1, A0}. In this case, the address bits {A3, A2, A1B, A0B} which are complementary to the address bits {A3B, A2B, A1, A0} take the "L" level, so that the transistors TR2, TR4, TR5 and TR7 are in the off state and conduct no current.

Thus, when the fuses connected to those transistors which receive the address bits {A3B, A2B, A1, A0} at their gates are blown, the current paths disappear, as a result of which even when the transistors TR1, TR3, TR6 and TR8 are rendered on no current flows and the word signal WD takes the "H" level.

Therefore, the replacement address decision device 2 selects a string of fuse numbers {F108, F106, F103, F101} as a fuse address for replacing the word line corresponding to the address signal {0, 0, 1, 1} with a redundancy word line.

When another word line to be replaced corresponds to an address signal {1, 0, 1, 0}, the replacement address decision device 2 selects a string of fuse numbers {F115, F114, F111, F110} as a fuse address for replacement with the redundancy word line.

In a similar manner, in order to replace a bit line with a redundancy bit line, the replacement address decision device 2 generates based on the above-described bitmap a string of fuse numbers {FC101, FC102, FC103, FC104} to render the redundancy bit line correspondent to the address of the bit line to be replaced.

In order to ensure that a supply voltage used internally to the semiconductor memory device (internal supply voltage) is equal to a predetermined voltage, the semiconductor memory device generates a reference voltage Vref and generates the internal supply voltage based on this reference voltage. This reference voltage Vref is generated based on a threshold voltage Vt of a transistor, but such threshold voltage varies in general depending on the processing steps in the manufacturing line. It is therefore necessary to measure the threshold voltage Vt with an LSI tester 1 and carry out an adjustment so that the level of the reference voltage Vref becomes equal to the predetermined voltage. This adjustment to obtain the predetermined voltage is also carried out by blowing fuses.

More specifically, the replacement address decision device 2 determines a string of Vref fuse numbers of those fuses to be blown to obtain the predetermined reference voltage Vref based on the threshold voltage Vt measured by the LSI tester 1 for each semiconductor device chip. Such a string of Vref fuse numbers is formed for each chip as the string of numbers {FY101, FY102, FY103, FY104, . . . } for the chip No. "CA001".

The replacement address decision device 2 has to output the strings of fuse numbers successively, in the case of the strings of fuse numbers for the row fuse numbers of FIG. 12, ". . . ; ROW FUSE NO. (F101); ROW FUSE NO. (F103); ROW FUSE NO. (F106); ROW FUSE NO (F108); ROW FUSE NO. (F110); ROW FUSE NO. (F113); ROW FUSE NO. (F114); ROW FUSE NO. (F115); . . . " are described as a series of fuse addresses.

For this reason, the chip position analyzing device 42 generates table format data shown in FIG. 14, in which starting row fuse numbers of strings of row fuse numbers of redundancy words line corresponding to words line to be replaced and starting column fuse numbers of strings of column fuse numbers of redundancy bit lines corresponding to bit lines to be replaced, in the order of the redundancy word or bit lines used. The chip position analyzing device 42 stores this table format data in a redundancy address table file 44.

In this case, the column fuse numbers are arranged to start from F501 and represent address signals each constituted by four bits in a manner similar to the row fuse numbers.

Furthermore, the fuse numbers F101 to F108 form a group GR1, the fuse numbers F109 to F116 a group GR2, . . . , the fuse numbers F501 to F508 a group GL1, and the fuse numbers F509 to F516 a group GL2.

In this case, F502, F502, F503, F504, . . . correspond to FY101, FY102, FY103, FY104, . . . .

Thus, as shown in FIG. 14, a character string [ROW FUSE FIRST NO "F101, GR1"] which indicates that the starting fuse number of the group GR1 is fuse F101 is described in an area R51. A character string [ROW FUSE FIRST NO "F109, GR2"] which indicates that the starting fuse number of the group GR2 is fuse F109 is described in an area R52.

In a similar manner, the starting numbers of fuses forming respective groups each corresponding to fuses for replacement with a redundancy word line are described.

In FIG. 14, a character string [COL FUSE FIRST NO "F501, GL1"] which indicates that the starting fuse number of the group GL1 is fuse F501 is described in an area R61. A character string [COL FUSE FIRST NO "F509, GL2"] which indicates that the starting fuse number of the group GL2 is fuse F509 is described in an area R62.

In a similar manner, the starting numbers of fuses forming respective groups each corresponding to fuses for replacement with a redundancy bit line are described.

The chip position analyzing device 42 uses the starting fuse numbers described in the table format shown in FIG. 14 to divide the string of fuse addresses of row fuse numbers and the string of fuse addresses of column fuse numbers shown in FIG. 12 into groups of fuse addresses each composed of the numbers of row fuses to be blown or the numbers of column fuses to be blown.

Furthermore, the chip position analyzing device 42 processes the fuse address file shown in FIG. 12 to produce an intermediate file shown in FIG. 15. As shown in FIG. 15, this intermediate file is a file formed by rearranging the character strings separated by ";" in the fuse address file of FIG. 12 so that they are described in a single line. Herein, the above-described fuses F101 to F108 and F501 to F508 are used for the row fuse numbers and the column fuse numbers.

The replacement address decision device 2 generates redundancy addresses from the above intermediate file.

In this case, each redundancy address represents the address of a word and a bit line which has been replaced with a redundancy word and a redundancy bit line.

The chip position analyzing device 42 divides, based on the table format data stored in the redundancy address table file 44, the string of fuse addresses in the intermediate file shown in FIG. 15 into groups of fuse addresses each composed of row fuse numbers of the fuses to be blown or column fuse numbers of the fuses to be blown.

For example, the chip position analyzing device 42 divides the string of fuse addresses composed of row fuse numbers of the fuses to be blown into the group GR1 {F108, F106, F103, F101}, group GR2 {F115, F114, F113, F110}, . . . .

Then, the chip position analyzing device 42 carries out a processing step for converting each group of fuse addresses thus obtained by the division into a redundancy address.

For example, the chip position analyzing device 42 converts odd fuse numbers in the group GR1 {F108, F106, F103, F101} of the row fuse numbers of group GR1 into "1" s and converts even fuse numbers in the group into "0"s.

In a similar manner, the chip position analyzing device 42 converts the divided fuse addresses of other groups into data of "0" and "1".

Then, the chip position analyzing device 42 converts the group GR1 {0, 0, 1, 1}, group GR2 {1, 0, 1, 0}, . . . obtained by the above conversion respectively into their hexadecimal representations to obtain the redundancy addresses of group GR1 {3}, group GR2 {A}, . . . Similarly, the chip position analyzing device 42 converts the group GL1 {1, 0, 1, 0}, group GL2 {0, 0, 0, 1}, . . . respectively into their hexadecimal representations to obtain the redundancy addresses of group GL1 {A}, group GL2 {1}, . . . .

Next, a method of converting the fuse address file data into replacement addresses will be described.

The chip position analyzing device 42 produces a redundancy address table having a format shown in FIG. 16 for each wafer in a lot, for example. This redundancy address table is a table which shows the relation between redundancy addresses on one hand and a lot number, a wafer number and chip numbers on the other hand.

The chip position analyzing device 42 stores the produced redundancy address tables in the redundancy address table file 44.

As shown in FIG. 16, a character string "XXXX" of year, month and day representing the date of manufacturing of this redundancy address table is described in an area R60 for item "DATE". A lot number to which the wafer has belonged in the wafer process is described in an area R61 of item "Lot Name" as a character string "CB95-3030". This item "Lot Name" corresponds to "LOT NO","LOT NAME" of FIG. 12.

A number of the wafer in the lot of the above lot number is described in an area R62 for item "Wafer Number" as a character string "W0001". This item "Wafer Number" corresponds to the item of the identifier "W" and the lot number "XX01" of FIG. 12.

A chip number representing coordinates of the chip on the above wafer is described in an area R63 for item "Chip Name" as a character string "C06,31". This item "Chip Name" corresponds to the identifier "C" and the chip number "A001" of FIG. 12.

A value based on a fuse address for the adjustment of the value of the voltage Vref of the chip bearing the chip number "C06,31" is described in an area R64 for item "Vref number" as a character string "4".

A character string of "GR1" representing the group GR1 which is a number of the fuse group in which a redundancy address (an address of a word line to be replaced) is written and a character string of "3" representing the above redundancy address are described in an area R65. More specifically, as will be appreciated from the description made before about fuse addresses, fuses in the group GR1 are blown so as to represent the address "3" 0f the word line to be replaced, as a result of which an address of the redundancy word line corresponding to this group GR1 becomes equal to "3" whereby the word line is replaced with the redundancy word line.

Similarly, a character string of "GR2" representing the group GR2 which is a number of the fuse group in which a redundancy address is written and a character string of "A" representing the above redundancy address are described in an area R66.

Furthermore, a character string of "GR3" representing the group GR3 which is a number of the fuse group in which a redundancy address is written and a character string of "-" indicating that the redundancy word line of this fuse group is not used are described in an area R67.

For each of the groups GR4 and its succeeding groups, in a manner similar to the groups GR1 to GR3, a character string of a redundancy address is indicated below as a number of the group used and a character string "-" is indicated below as a number of the group not used.

A character string of "GL1" representing the group GL1 which is the number of the fuse group in which a redundancy address (an address of a bit line to be replaced) is written and a character string of "A" representing the above redundancy address are described in an area R68. More specifically, as will be appreciated from the description made before about fuse addresses, fuses in the group GL1 are blown so as to represent the address "A" 0f the bit line to be replaced, as a result of which an address of the redundancy bit line corresponding to this group GL1 becomes equal to "A" whereby the bit line is replaced with the redundancy bit line.

Similarly, a character string of "GL2" representing the group GL2 which is the number of the fuse group in which a redundancy address is written and a character string of "1" representing the above redundancy address are described in an area R69.

For each of the groups GL3 and its succeeding groups, in a manner similar to the groups GR1 to GR3 and the groups GL1 and GL2, a character string of a redundancy address is indicated below the number of the group used and a character string "-" is indicated below the number of the group not used.

A character string "C06, 32" representing the number of the next chip is described in an area R71 as an item of "Chip Name".

A value based on a fuse address for the adjustment of value of the voltage Vref of the chip bearing the chip number "C06,32" is described in an area R72 for item "Vref number" as a character string "5".

Thereafter, in a similar manner, redundancy addresses of the chip bearing the chip number "C06,32" and numbers of the fuse groups in which these redundancy addresses are written, respectively, are described in the order of the redundancy word lines and the redundancy bit lines.

In this manner, a redundancy address corresponding to a chip number which represents a position (coordinates) of the chip is described in the above redundancy address table with respect to all the semiconductor device chips on a wafer corresponding to this file.

In this case, the combination of redundancy addresses corresponding to each chip number represents data which correspond to the lot number, wafer number and chip number in the wafer process.

More specifically, the combination of redundancy addresses is a combination derived from the bitmap representing addresses of the defective cells in the chip, i.e., a combination of addresses of the word and bit lines to be replaced, and may therefore be different from one chip to another with a very high probability. In other words, it can be said that the probability of co-existence of semiconductor device chips having the same redundancy address is almost zero with respect to all the chips in a lot.

The reason for this is as follows. In order that the chip on the wafer No. "01" bearing the chip number "C06,31" and the chip on the wafer No. "01" bearing the chip number "C06,32" both described above are determined to be the same chip, their redundancy addresses for the word lines as well as their redundancy addresses for the bit lines must be identical to each other.

For example, if the item of the group GR7 described in the area R70 for the chip number "C06,31" takes in the corresponding area for the chip number "C06,32" a character string other than "4" or a character string "-", then it is determined that the chip bearing the chip number "C06,31" and that bearing the chip number "C06,32" are different chips.

In addition, although the word lines and the bit lines have been assumed to have addresses each composed of four bits only in the above description for the sake of convenience, the number of bits is much greater in actual devices. For example, it is here assumed that the semiconductor device has 128 M bits and a data bus 8-bit wide and is arranged in four banks. In this case, the number of address signal lines for representing an address of a word line is twelve (bit 0 to bit 11) and the number of address lines for representing an address of a bit line is ten (bit 0 to bit 9). These signal lines are divided into sets of signal lines and used in the redundancy area.

For example, for the address signal lines for representing an address of a word line eight lines are selected from bit 0 to bit 11 to provide $2^8=256$ addresses, while for the address signal lines for representing an address of a bit line eight lines are selected from bit 0 to bit 9 to provide $2^8=256$ addresses. There are 128 such sets for each and 256 sets in total. The width of the data bus is not restricted to eight bits, and the number of address signals is not restricted to the above numbers.

Not only in this application but also in general, when selecting eight address signal lines from the twelve address signal lines of bit 0 to bit 11 for representing the address of a word line, for example, the bit 0 of the address signals corresponding to the least significant bit is excluded in most cases. When the replacement is performed with the address signal line of the least significant bit being excluded, adjoining addresses whose address values except for the least significant bit are the same are replaced simultaneously. When dust or the like causes a failure which needs replacement, the probability that adjoining word lines or adjoining bit lines are also faulty is high. Thus, it is advantageous that adjoining word lines or adjoining bit lines are replaced simultaneously.

As described above, there are 256 sets of redundancy circuits, wherein each set can select up to 256 addresses. Although it may depend on the result of the manufacturing, a device will become PASS in most cases when sets of redundancy circuits of the order of 100 are used. Conversely speaking, the fact that the circuit design was made such that there are 256 sets of redundancy circuits provided, the design must have anticipated that half of that number would be used.

If ten sets of redundancy circuits are sufficient for a device to become PASS, the provision of 256 sets of redundancy circuits is excessive and may indicate a wasteful design. If 300 sets of redundancy circuits are necessary to have a device become PASS, the provision of 256 sets of redundancy circuits may indicate a lack of foresight in the design stage.

A calculation will now be made to determine how many combinations exist for 100 sets of redundancy circuits wherein each set can take any value of 256 addresses. The number of combinations of 100 sets selected from 256 sets is expressed as:

$$A \cdot _{256}C_{100} = 256!/100! \quad (1)$$

where C represent "combination". Since there are 100 sets each taking any one of 256 addresses, the number of combinations thereof is expressed as:

$$B = 256^{100} = 10^{(100 \times \log(256))} = 10^{800 \times \log 2} \approx 10^{240} \quad (2)$$

Thus, the number of events which A and B can take is A×B which is an astronomical number. However, the results of the above formula (1) vary depending on how a remedying calculation routine, which is a part of a program for determining redundancy addresses, is programmed. Although no restriction is imposed on the calculation of the number of combinations in the formula (1), when redundancy circuits are actually used, the number of combinations is restricted by the remedy calculation and is lower than the number of combinations (i.e. 256!/100!) obtained by the formula (1). For example, when the remedy calculation is carried out from row addresses, the redundancy memory on the row side will preferentially be used, whereas when the calculation is carried out from the column side the row side will not be used much. Since the selection is not made completely at random, the value of A will decrease depending on the way the remedy calculation is performed. But, there will still be at least several hundreds of combinations and the value of A will never be below "1".

Even if it is assumed that A is equal to "1", the number of combinations of redundancy addresses is at least:

$$A \times B \cdot 1 \times B = 10^{240} \quad (3)$$

When the number of wafers in each lot is 25 with each wafer having 200 chips thereon, the total number of chips in one lot is 5000 which is significantly small as compared to the number of combinations for redundancy addresses.

Thus, as a finger print which enables one particular person to be distinguished from a number of persons, the above combination of redundancy addresses enables a particular chip on a particular wafer in a lot of a particular lot number to be distinguished from a population of all the chips included in a plurality of lots. That is to say, one particular chip in the population can be identified.

From the foregoing, we can say that the probability that a plurality of chips having the same combination of redundancy addresses is substantially null even taking into consideration the number of lots.

Even when a plurality of chips have the same combination of redundancy addresses, it will be expected that the number of such chips having the same combination is significantly low for the above reason. Therefore, when statistical processing for detecting abnormal conditions in each processing step of the wafer process is carried out with respect to a population of all the chips, the number of chips having the above-described combination can be treated as noise in the calculation made for this statistical processing.

Figure 22:
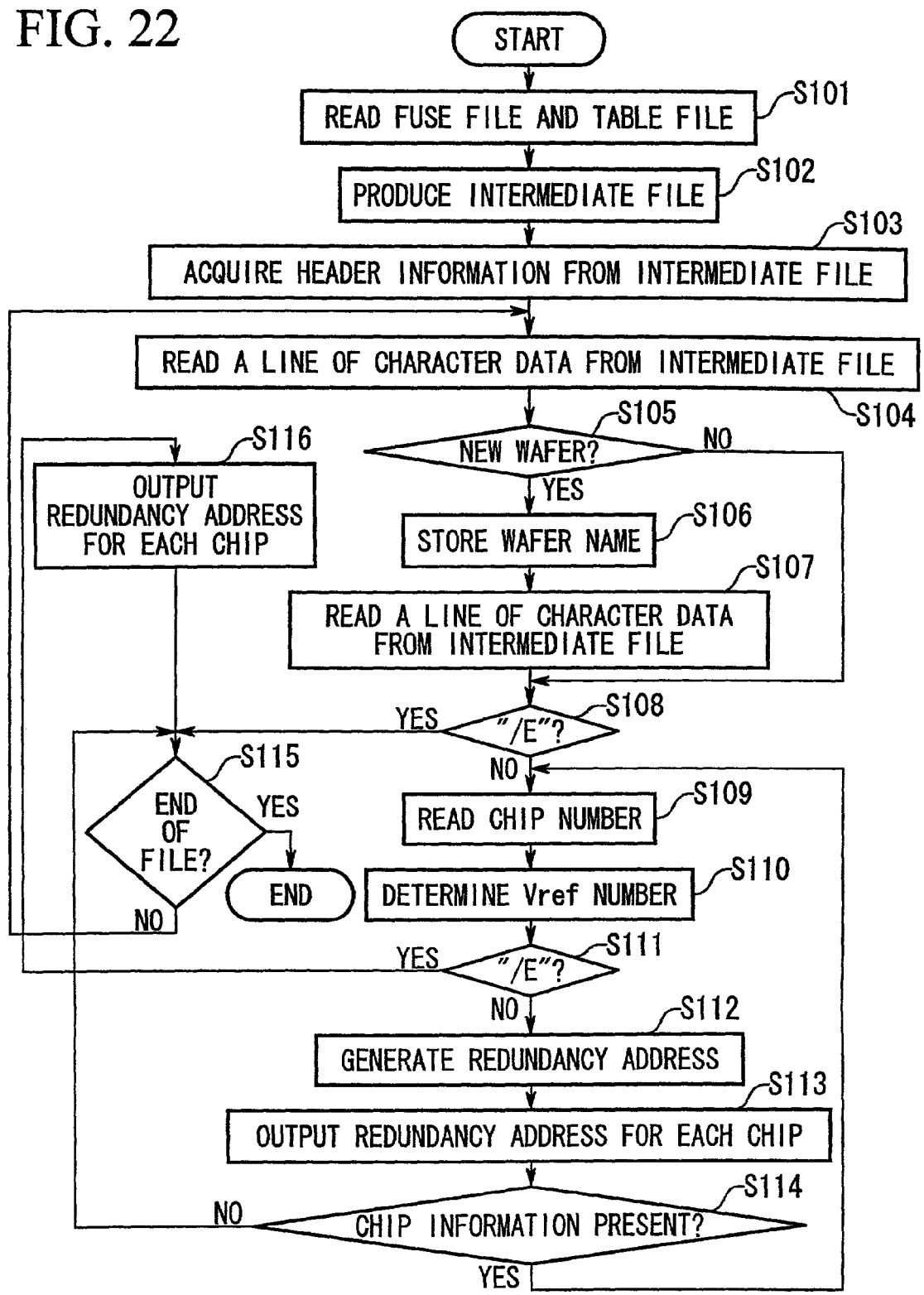
FIG. 22 is a flow chart showing the process for generating a redundancy address corresponding to the lot number, the wafer number and the chip number of each chip from fuse addresses of chips of the semiconductor devices after the wafer process.
Figure 23:
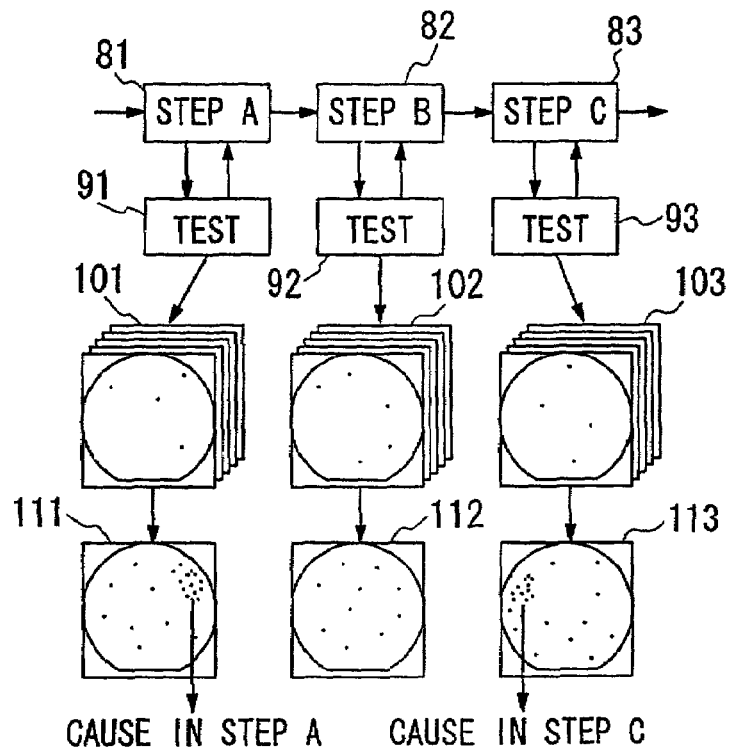
FIG. 23 is a diagrammatic illustration showing a step for analyzing failures found in the related art.
Figure 24:
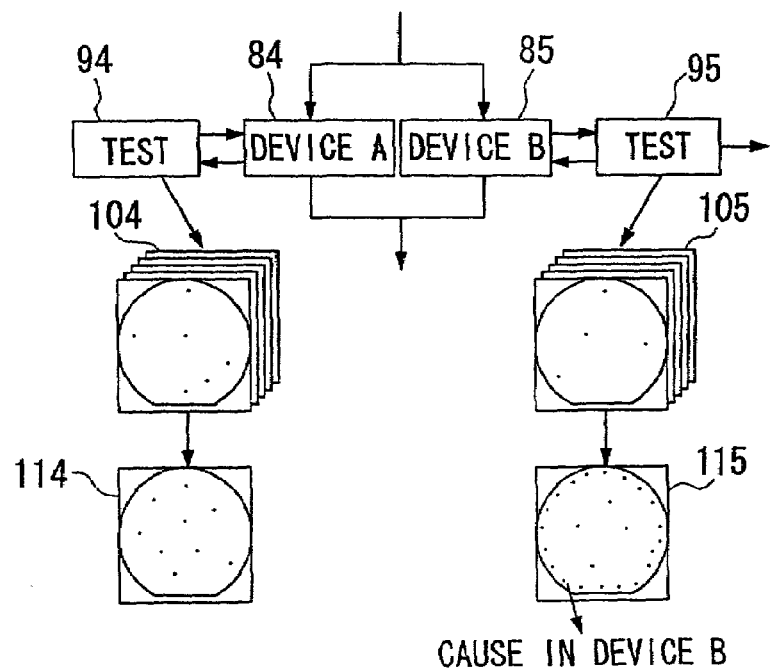
FIG. 24 is a diagrammatic illustration showing another step for analyzing failures found in the related art.
Figure 25:
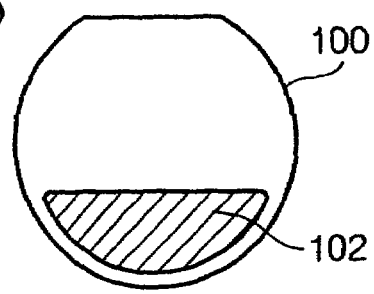
FIG. 25 is a diagrammatic illustration showing the surface of a wafer in which the positions of semiconductor devices which have been determined as faulty are shown.
Figure 26:
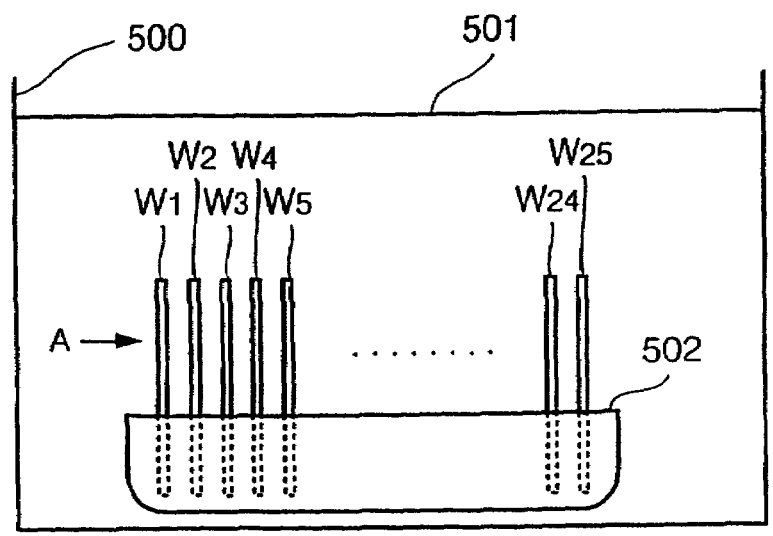
FIG. 26 is a diagrammatic illustration showing in side elevation wafers positioned in a boat (a vessel for supporting a plurality of wafers)

The chip position analyzing device 42 extracts redundancy addresses for each chip from the fuse information file 5 in accordance with the flow chart in FIG. 22.

The processing for extracting redundancy addresses for each chip from the fuse address file will now be described with reference to the flow chart shown in FIG. 22.

The chip position analyzing device 42 comprises a CPU and a memory wherein the CPU carries out processing in accordance with programs stored in the memory.

In step S101, the chip position analyzing device 42 reads the fuse address data and the table file data from the fuse information file 5 and the redundancy address table file 44, respectively, and stores them in a storage section provided therein.

In the next step S102, the chip position analyzing device 42 produces from the read fuse address data an intermediate file shown in FIG. 15.

Subsequently, the chip position analyzing device 42 reads from the intermediate file header information such as the product name and the lot number, e.g., the character string Product Name "128M/SDRAM (128 Mbit Synchronous RAM)", Lot Number "CB95-3030", and stores it in a predetermined area of the internal storage section in step S103.

In step S104, the chip position analyzing device 42 reads a line of data, i.e., the character string wafer number "W0001", from the intermediate file.

In the next step S105, the chip position analyzing device 42 determines whether the character string read in step S104 represents a new wafer number. In this case, since the identifier present at the top of the character string is "W", the chip position analyzing device 42 determines that it is a new wafer number and causes the processing to proceed to step S106.

If the identifier is a character other than "W", the chip position analyzing device 42 causes the processing to proceed from step S105 to step S108. In this step S108, the chip position analyzing device 42 determines whether this is the case where no fuse is used. More specifically, when it has been determined to be PASS without any defective cell or when failures have occurred on the entire surface of the wafer, the fuses are not used at all, so that the chip position analyzing device 42 causes the processing to proceed to step S115 which will be described later. In the present case, since it has been premised that fuses are used, step S109 which will be described later is carried out subsequently to step S108.

In step S106, the chip position analyzing device 42 extracts the wafer number "0001" from the character string of the identifier "W" and the wafer number "0001" which was read in step S104, and stores this wafer number "0001" in a predetermined area of the above-described storage section.

In the next step S107, the chip position analyzing device 42 read from the intermediate file a line of data, i.e., the character string of the identifier "F" and the Vref fuse number "Y101".

Then, the chip position analyzing device 42 determines whether the read character string, i.e., the identifier "F", agrees with the character string of the identifier "/E" which represents the end of wafer information. In the present case, since the character string of the identifier "F" and the Vref fuse number "Y101" does not agree with the character string of the identifier of ending "/E", the chip position analyzing device 42 determines that the read character string is different from the identifier "/E" and causes the processing to proceed to step S109.

In this step S109, the chip position analyzing device 42 continuously reads, until a character string representative of a chip number is reached, the identifiers "F" and the Vref fuse numbers "Y102", . . . which represent the numbers of fuses for the setting of level of the voltage Vref, and upon detection of the character string "CHIP NO." stores all the read Vref fuse numbers "Y101", "Y102", . . . in a predetermined area of the storage section and reads the character string on the line of the chip number, i.e., the character string of the identifier "C" and the chip number "A001".

Then, the chip position analyzing device 42 extracts the chip number "A001" from the read character string of the identifier "F" and the chip number "A001" and stores this chip number "A001" in a predetermined area of the storage section.

Subsequently, in step S110, Vref numbers are formed based on the combination of the strings of fuse numbers Vref fuse number "Y101", Vref fuse number "Y102", . . . stored in the above storage section. The relation between Vref numbers and combinations of strings of fuse numbers has been stored in the storage section.

In the next step S111, the chip position analyzing device 42 reads from the intermediate file a line of data, i.e., the character string "ROW FUSE NO. F101".

Then, the chip position analyzing device 42 determines whether the character string read next to the above chip number is an identifier of ending "/E" or not.

In the present case, since the read character string "ROW FUSE NO. F101" does not coincide with "/E", the chip position analyzing device 42 determines that the read character string is not "/E" and causes the processing to proceed to step S112. In the meantime, when no other fuses than those for the setting of level of the voltage Vref are used, the identifier "/E" is read and the result of the determination made in step S111 will be "YES". In that case, the chip position analyzing device 42 causes the processing to proceed to step S116 wherein processing similar to that in step S113 described later is performed and then the processing proceeds to step S115 which will be described later.

In step S112, the chip position analyzing device 42 continuously reads, until a character string representative of the next chip number is detected, fuse numbers "ROW FUSE NO. F101", "ROW FUSE NO. F103", . . . , "COL FUSE NO. F501", "COL FUSE NO. F503", . . . , divides the string of these fuse numbers into fuse groups corresponding respectively to the redundancy word lines and the redundancy bit lines in accordance with the table file, and generates redundancy addresses from each of the fuse groups.

For example, the chip position analyzing device 42 divides the string of fuse numbers {F101, F103, F106, F108, F110, F113, F114, F115, . . . , F501, F503, F506, F507, F509, F512, F514, F516, . . . } based on the table format data and then rearranges the fuse numbers to thereby form fuse group GR1 {F108, F106, F103, F101}, fuse group GR2 {F115, F114, F113, F110}, . . . , fuse group GL1 {F507, F506, F503, F501}, fuse group GL2 {F516, F514, F512, F509}, . . . .

Then, the chip position analyzing device 42 converts each odd fuse number and each even fuse number into data "1" and data "0", respectively, in the groups GR1, . . . , GL2, . . . to thereby form group GR1 {0, 0, 1, 1}, group GR2 {1, 0, 1,0}, . . . , group GL1 {1, 0, 1, 0}, group GL2 {0, 0, 0, 1 }, . . . .

Then, the chip position analyzing device 42 converts each bit series in the groups GR1, . . . , GL2, . . . into hexadecimal numbers to form redundancy addresses as group GR1 {3}, group GR2 {A}, . . . , group GL1 {A}, group GL2 {1}, . . . .

The chip position analyzing device 42 then causes the processing to proceed to step S113.

In step S113, the chip position analyzing device 42 writes the obtained combination of redundancy addresses in the redundancy address table of FIG. 16, which is stored in the redundancy address table file 44, corresponding to the chip number "A001", i.e., the chip number "C06, 31".

In this case, the chip position analyzing device 42 also writes the lot number "C95-3030" and the wafer number "0001", which have been stored in the storage section, together with the chip number "C06, 31" in the redundancy address table corresponding to the combination of redundancy addresses.

Subsequently, in step S114, the chip position analyzing device 42 reads a character string of the next line, i.e., a character string of the identifier "C" and the chip number "A002".

The chip position analyzing device 42 then determines whether the read character string represents a chip number or not.

In the present example, since the read character string is the chip number "A002", the chip position analyzing device 42 determines that the read character string represents a chip number and that there is chip information (a chip number, fuse numbers) still remaining, and causes the processing to proceed to step S109.

Thereafter, the chip position analyzing device 42 repeats the processing from step S109 to step S114 to write successively the obtained combinations of redundancy addresses together with corresponding chip numbers in the redundancy address table stored in the redundancy address table file 44, until the character string "/E" representing an end of wafer information is detected instead of a chip number in step S111 or when the character string "/E" representing an end of wafer information is detected and it is determined that there is no chip information remaining in step S114.

When the character string "/E" representing an end is detected in step S111 or in step S114, the chip position analyzing device 42 recognizes that processing of one wafer has been completed and causes the processing to proceed to step S115.

In this step S115, the chip position analyzing device 42 reads a character string of the next line to determine whether the end of the fuse address file has been reached or not, e.g., whether "EOF" (End of File) is detected or not.

In this case, if the chip position analyzing device 42 reads a character string of the identifier "W" and a number "0002" which together represent a wafer number, it recognizes that the end of the fuse address file has not been reached and causes the processing to proceed to step S104.

Thereafter, the chip position analyzing device 42 repeats the processing from step S104 to step S115 as described above to generate redundancy addresses for the wafer number "0002" and its subsequent wafers until it is determined that the end of the fuse address file has been reached at step S115, i.e., until the generation of redundancy addresses for all the wafers in the lot of the lot number "CB95-3030" has been completed.

When the chip position analyzing device 42 reads a character string of the next line and detects that it is the end of the fuse address file, i.e., when "EOF" is detected, this processing for the generation of redundancy addresses (the flowchart of FIG. 22) is terminated.

Hereinafter, a method (a roll call method) for extracting replacement addresses from an assembled semiconductor device (an assembly) with the replacement address reading device 41 will be described with reference to FIGS. 17 and 18.

Figure 17:
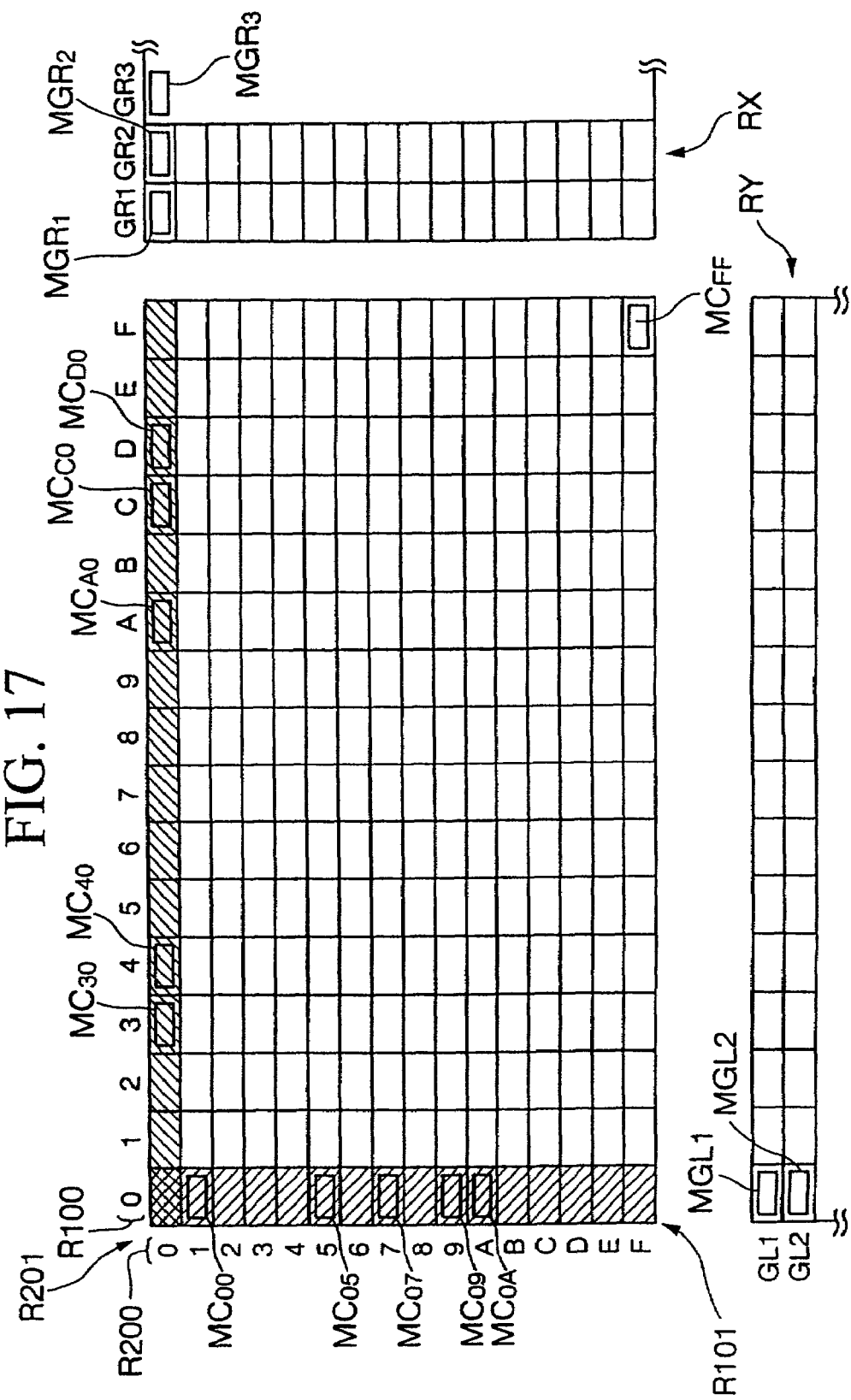
FIG. 17 is a diagrammatic illustration showing the structure of a memory cell array and memory cells for redundancy.
Figure 18:
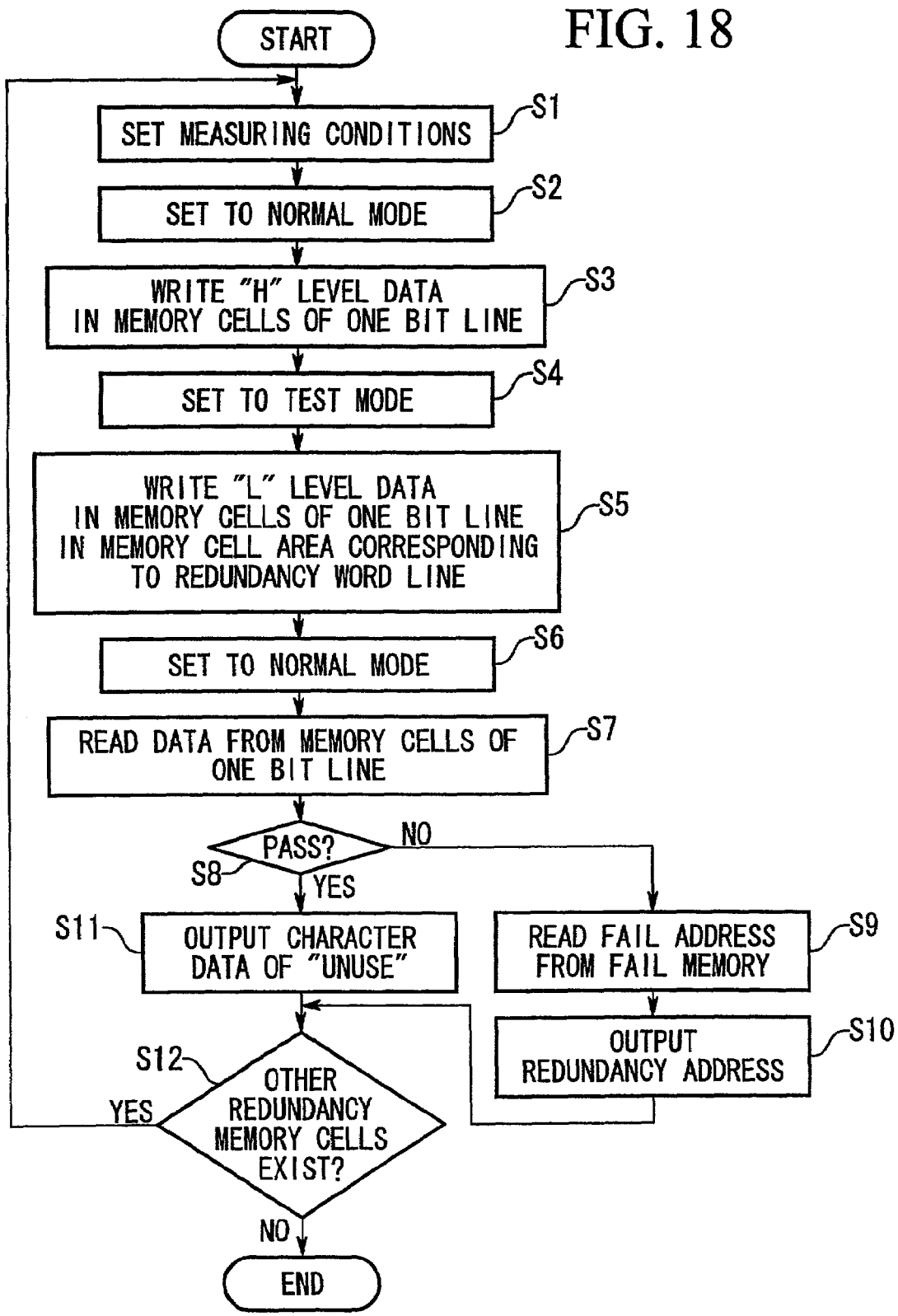
FIG. 18 is a flow chart showing the extraction of redundancy addresses in the LSI tester of FIG. 1.

FIG. 17 is a diagrammatic illustration showing each structure of a memory cell array and memory cells for redundancy. FIG. 18 is a flowchart explaining the processing for the extraction of redundancy addresses in the replacement address reading device 41.

In FIG. 17, character strings "0" to "F" described in an area R100 represent addresses of word lines arranged to extend in the column direction, while character strings "0" to "F" described in an area R200 represent addresses of bit lines arranged to extend in the row direction. A memory cell is arranged at each intersection of the word lines and the bit lines.

For example, a memory cell MCFF is disposed at the intersection of the word line F and the bit line F.

RX designates a redundancy memory cell area corresponding to redundancy word lines, while RY designates another redundancy memory cell area corresponding to redundancy bit lines.

The redundancy memory cell area RX is separated into blocks of memories connected to redundancy word lines corresponding to group GR1, group GR2, . . . , respectively.

In a similar manner, the redundancy memory cell area RY is separated into blocks of memories connected to redundancy bit lines corresponding to group GL1, group GL2, . . . , respectively.

The processing for extracting redundancy addresses in the replacement address reading device 41 will now be described with reference to the flowchart of FIG. 18. In the following description, operations in respective steps are shown in the order in which a CPU in the replacement address reading device 41 operates in accordance with measuring programs stored in a storage section provided therein to control arithmetic operations of necessary data and measuring circuits needed for the measurements by the CPU.

In step S1, test conditions such as values of input voltages/input currents to be supplied to a semiconductor device in the test, timing data for measuring the operation speed and a pattern in accordance with which the semiconductor device is operated are set in the storage section of the replacement address reading device 41 in accordance with the specification of the semiconductor device to be tested as described in the reference manual.

Subsequently, in step S2, the replacement address reading device 41 causes the semiconductor device to operate in a normal mode by the CPU.

Herein, the normal mode means a mode in which write and read operations are performed with failed bits being replaced with redundancy circuits.

Specifically, when writing data in memory cells of the semiconductor device with the replacement address reading device 41, if an access is made to a word line which has not been replaced with a redundancy word line the data is written into those memory cells which are connected to the word line, whereas if an access is made to a word line which has been replaced with a redundancy word line the data is not written into the memory cells corresponding to this word line but is written into those memory cells which correspond to a group or a redundancy word line in which the address of the above word line has been written.

For example, when writing data into a memory cell area of the column corresponding the word line 3 is attempted, the data is written into the memory cell area of the row corresponding to the replacing group GR1. In this case, however, the writing party (i.e., the replacement address reading device 41) carries out such writing without being aware whether the specified word line has been replaced or not and with which fuse group it has been replaced. As a matter of course, when reading data stored in memory cells, the reading party (i.e., the replacement address reading device 41) is not aware whether the specified word line has been replaced or not and with which fuse group it has been replaced.

In the next step S3, the replacement address reading device 41 writes "H" level data in memory cells of one bit line, for example, in all the memory cells in memory cell area R201 in a column (extending in the bit-line direction, in the horizontal direction in FIG. 17).

It is here assumed that the word line 3 has been replaced with the redundancy word line corresponding to the group GR1, the word line A with the redundancy word line corresponding to the group GR2, and the word lines 4, C and D with other redundancy word lines.

Therefore, the "H" level data to be written into the memory cells MC30 and MCA0 are actually written into the memory cells MGR1 and MGR2 in the redundancy memory cell area RX, respectively.

Similarly, the "H" level data to be written into the memory cells MC40, MCC0 and MCD0 are written into the redundancy memory cell area RX at the memory cells corresponding to the replacing redundancy word lines, respectively.

In the next step S4, the replacement address reading device 41 sets the semiconductor device to operate in the test mode by the CPU.

Herein, the test mode means a mode in which addresses determined by the word lines 0 to F and the bit lines 0 to F are not used and data is written in memory cells of specific addresses in the redundancy memory cell areas RX and RY.

More specifically, the redundancy memory cell area RX and the redundancy memory cell area RY are separated, through the application of data of a specific pattern to a plurality of predetermined pins of the semiconductor device, from the normal address decoder and connected to a decoder provided for testing the redundancy memory cell area RX and the redundancy memory cell area RY. Thereby, the semiconductor device can write data into memory cells of specific addresses in the redundancy memory cell areas RX and RY with the writing party (the replacement address reading device 41) being aware of this.

Subsequently, in step S5, the replacement address reading device 41 writes "L" level data into memory cells of one bit line in the memory cell area corresponding to the group GR1 which is the first fuse group, i.e., into the memory cell MGR1.

Thus, the data stored in the memory cell MGR1 is changed from "H" level to "L" level.

In the next step S6, the replacement address reading device 41 returns the operation mode of the semiconductor device from the test mode to the normal mode.

In the next step S7, the replacement address reading device 41 reads data of all the memory cells of one bit line, i.e., all the memory cells in the memory cell area R201, sequentially determines whether each read data agrees with the initially written corresponding "H" level data, and writes that address of the redundancy word line corresponding to the faulty memory cell in a not-shown failure memory.

In this case, the data stored in the memory cell MGR1 has been changed to "L" level.

Since the semiconductor device is in the normal mode, the replacement address reading device 41 writes the address "3" of the replaced word line 3 in the failure memory as the address of the redundancy word line corresponding to the group GR1.

In the next step S8, the replacement address reading device 41 makes a search through the failure memory to determine whether there is any failed memory cell or not, i.e., whether the semiconductor device has passed the test or not.

In the present case, since the address data is present in the failure memory, the replacement address reading device 41 causes the processing to proceed to step S9.

In this step S9, the replacement address reading device 41 reads the address "3" of the word line 3 stored in the failure memory. This address "3" is the redundancy address.

Thus, by writing "H" level data in all the memory cells of one bit line in the normal mode, the "H" level data are written into those memory cells which have not been replaced as they are.

On the other hand, the "H" level data attempted to be written into a memory cell which corresponds to a replaced word line, for example the memory cell MC30 described above, is written into the memory cell MGR1, which corresponds to the redundancy word line of the group GR1 in the redundancy memory cell area RX replacing the word line 3, by the replacement address reading device 41 as described above for step S3.

Then, the replacement address reading device 41 changes the operation mode of the semiconductor device to the test mode and writes "L" level data into the memory cell MGR1 in the redundancy memory cell area RX.

Subsequently, the replacement address reading device 41 returns the operation mode of the semiconductor device to the normal mode, reads data from all the memory cells in the memory cell area R201 corresponding to the bit line 0 and detects each memory cell in which the data has been changed from "H" level to "L" level, whereby the word line 3 which has been replaced with the word line of the group GR1 corresponding to the memory cell MGR1 can be detected.

In step S10, the replacement address reading device 41 outputs the detected address "3" of the word line 3 to the replacement address information file 43 of FIG. 11 as a replacement address for the word line. FIG. 19 shows a table for indicating a value of each replacement address thus derived and the corresponding fuse numbers of fuses constituting a group, such table being produced for each sample number. The replacement address information file 43 shown in FIG. 19 corresponds to the sample number "SP001".

For example, a character string "F101–F108" representing fuses constituting the group GR1 and a character string "3" are described in an area R301 for an item "FUSE" and an item "REDUNDANCY ADDRESS" corresponding to the group GR1, respectively, by the replacement address reading device 41.

The replacement address reading device 41 then causes the processing to proceed to step S12.

In this step S12, the replacement address reading device 41 determines whether there are any other redundancy word lines in the redundancy memory cell area RX or not.

Since there is a subsequent redundancy word line, i.e., the word line corresponding to the group GR2, the replacement address reading device 41 causes the processing to return to step S1 as a result of the above determination.

In this case, in each of the steps S1 to S4, processing similar in content to that described above for a corresponding step is carried out.

In step S5, however, the replacement address reading device 41 writes "L" level data into memory cells of one bit line in the memory cell area corresponding to the group GR2 which is the second fuse group, i.e., into the memory cell MGR2.

As a result, the data stored in the memory cell MGR2 is changed from "H" level to "L" level.

Then, in each of the steps S6 to S9, processing similar in content to that described above for a corresponding step is carried out.

In step S10, the replacement address reading device 41 stores the detected address "A" of the word line A in the replacement address information file 43 as a replacement address of word line.

For example, a character string "F109 to F116" representing fuses constituting the group GR2 and a character string "A" are described in an area R302 as the item "FUSE" and the item "REDUNDANCY ADDRESS" corresponding to the group GR2, respectively, by the replacement address reading device 41.

The replacement address reading device 41 then causes the processing to proceed to step S12.

In this step S12, the replacement address reading device 41 determines whether there are any other redundancy word lines in the redundancy memory cell area RX or not.

Since there is a subsequent redundancy word line, i.e., the word line corresponding to the group GR3, the replacement address reading device 41 causes the processing to return to step S1 as a result of the above determination.

In this case, in each of the steps S1 to S4, processing similar in content to that described above for a corresponding step is carried out.

In step S5, the replacement address reading device 41 writes "L" level data into memory cells of one bit line in the memory cell area corresponding to the group GR3 which is the third fuse group, i.e., into the memory cell MGR3.

As a result, the data stored in the memory cell MGR3 is changed from "H" level to "L" level.

However, the redundant word line corresponding to this group GR3 has not been used to replace any word line, so that the data stored in any memory cell of the memory cell area R201 does not change.

Then, in each of the steps S6 and S7, processing similar in content to that described above for a corresponding step is carried out.

In step S8, since the data from every memory cell in the memory cell area R201 is at "H" level, the replacement address reading device 41 determines that no address data is present in the failure memory and causes the processing to proceed to step S11.

In this step S11, since no address data is present in the failure memory, the replacement address reading device 41 determines that the redundancy word line corresponding to the group GR3 has not replaced any word line, and stores a character string "UNUSE" representing the fact that the redundancy word line corresponding to the group GR3 has not been used in the replacement address information file 43.

For example, a character string "F117 to F124" representing fuses constituting the group GR3 and a character string "UNUSE" are described in an area R303 as the item "FUSE" and the item "REDUNDANCY ADDRESS" corresponding to the group GR3, respectively, by the replacement address reading device 41.

The replacement address reading device 41 then causes the processing to proceed to step S12.

Thereafter, the replacement address reading device 41 repeats the processing of from step S1 to step S12 to extract replacement addresses for the whole redundancy memory cell area RX, i.e., for all the redundancy word lines, and then starts the processing for extracting replacement addresses of the redundancy memory cell area RY, i.e., for the redundancy bit lines.

In this case, the processing for extracting replacement addresses for the redundancy bit lines is similar to that for the redundancy word lines.

Therefore, the processing for extracting replacement addresses for the redundancy bit lines will be described only in those respects in which it is different from the processing for extracting replacement addresses for the redundancy word lines, and description about the flow chart as a whole will be omitted.

In step S3, the replacement address reading device 41 writes "H" level data in memory cells of one word line, for example, in all the memory cells in memory cell area R101 in a row (extending in the word-line direction, in the vertical direction in FIG. 17).

In this case, the bit line 1 has been replaced with the redundancy bit line corresponding to the group GL2, the bit line A with the redundancy word line corresponding to the group GL1, and the bit lines 5, 7 and 9 with other redundancy bit lines in the memory cell area.

Therefore, the "H" level data to be written into the memory cells MC0A and MC01 is actually written into the memory cells MGL2 and MGL1 in the redundancy memory cell area RY, respectively.

Similarly, the "H" level data to be written into the memory cells MC05, MC07 and MC09 are written into the redundancy memory cell area RY at the memory cells corresponding to the replacing redundancy bit lines, respectively.

In step S5, the replacement address reading device 41 writes "L" level data into memory cells of one word line in the memory cell area corresponding to the group GL1 which is the first fuse group, i.e., into the memory cell MGL1.

As a result, the data stored in the memory cell MGL1 is changed from "H" level to "L" level.

In step S7, the replacement address reading device 41 reads data from all the memory cells of one word line, i.e., all the memory cells in the memory cell area R201, sequentially determines whether each read data agrees with the initially written corresponding data of "H" level or not, and writes that address of the redundancy bit line corresponding to the faulty memory cell in the not-shown failure memory.

In this case, the data stored in the memory cell MGL1 has been changed to "L" level.

Since the semiconductor device is in the normal mode, the replacement address reading device 41 writes the address "A" of the replaced bit line A in the failure memory as the address of the redundancy bit line corresponding to the group GL1.

In step S10, the replacement address reading device 41 stores the detected address "A" of the bit line A in the replacement address information file 43 shown in FIG. 11 as a bit line redundancy address. FIG. 19 is the table for indicating a value of each replacement address thus derived and the corresponding fuse numbers of fuses constituting a group, such table being produced for each sample number. The replacement address information file 43 shown in FIG. 19 corresponds to the sample number "SP001".

For example, a character string "F501 to F508" representing fuses constituting the group GL1 and a character string "A" are described in an area R351 for an item "FUSE" and an item "REDUNDANCY ADDRESS" corresponding to the group GL1, respectively, by the replacement address reading device 41.

Thereafter, the replacement address reading device 41 repeats the processing from step S1 to step S12 to extract replacement addresses for the whole redundancy memory cell area RY, i.e., for all the redundancy bit lines, and then terminates the processing for replacement addresses with respect to one assembly.

The processing for extracting replacement addresses for each chip is repeatedly carried out for all the wafers in the lot.

As described above, according to this embodiment, by making a search through the redundancy address table for a chip which has the same combination of redundancy addresses as that in the replacement address information file 43, it becomes possible to obtain lot, wafer and chip numbers of the chip without destroying the package of the assembled semiconductor device.

Thus, according to the present embodiment, by making use of the electrical roll call method in the replacement address reading device 41, it becomes possible to read replacement addresses to thereby generate redundancy addresses for the detection of lot, wafer and chip numbers. Therefore, a number of semiconductor device assemblies can be evaluated each in the sealed-package state, and abnormal manufacturing devices and processing steps can be detected within a very short time period.

Furthermore, according to the present embodiment, since accurate wafer position information in a lot and accurate chip position information on a wafer in the wafer process can be obtained, abnormal manufacturing devices and processing steps can be detected with a high degree of accuracy.

Furthermore, by feeding the information about abnormal manufacturing devices and processing steps which has been obtained by the above-described analysis of failures back to the wafer process, measures to rectify these abnormal manufacturing devices and processing steps in the wafer process can quickly be taken.

Thus, by utilizing the present embodiments in the start (or development) of a new process, in the introduction of a new manufacturing device, in the introduction of a new product or in the process control of a currently used process, the cause of a failure can be located in an early stage and semiconductor devices can be manufactured stably.

Furthermore, the date of processing of a lot in each processing step can be determined from a lot number to facilitate the quality control of each processing step in the wafer process, and for the investigation of the cause of an abnormal processing step, and factors of the process itself such as its environment can be analyzed.

In the above description, although it has been assumed that the replacement address decision device 2 is constructed so as to generate redundancy addresses from fuse addresses, the replacement addresses determined by the replacement address decision device 2 can directly be outputted to the replacement address information file 43.

Specifically, it can be arranged such that the above-described replacement address signal {A3, A2, A1, A0}={0, 0, 1, 1} is expressed in hexadecimal notation to obtain the redundancy address "3".

As described above, in the second embodiment, the chip information is detected, after the division into chips, based on the replacement addresses of the redundancy circuit. As a result, it is not necessary to provide a dedicated chip position information storage area on a chip as in the third and fourth related art, and it is also not necessary to add manufacturing devices or processing steps to the wafer manufacturing line.

Therefore, the number of manufacturing steps and the chip size need not be increased, and the manufacturing cost of each semiconductor device will not increase.

In addition, since the replacement addresses are calculated based on the fuse information to be outputted to the trimming device, the amount of information that needs to be stored can be reduced significantly as compared to such related art in which the failure bitmap information is stored. For example, the failure bitmap information for a semiconductor memory of 128 M bits may amount to 16 M bytes per chip, 3.2 G bytes per wafer in the case of a 200 chip/wafer, and 16 G bytes per lot in the case of a 50 wafer/lot even when the information is stored on the 8 bit/word (byte) unit basis in the related art. In contrast, in the present embodiment, information in the amount of 0.1 k byte(=100 replacement addresses in average×8 bits) per chip, 20 k bytes per wafer in the case of a 200 chip/wafer and 1 M bytes per lot in the case of a 50 wafer/lot may suffice.

Furthermore, the cause of failures can also be estimated based on the distribution of failures which is formed using the replacement address information.

Thus, by storing the replacement address information, the chip position information and the information for the analysis of failures in the wafer process can be made common, so that it becomes possible to perform production control at the wafer manufacturing line with less stored information.

What is claimed is:

1. A semiconductor device manufacturing method comprising the steps of:

manufacturing wafers in a manufacturing line using predetermined manufacturing processed, each of said wafers having a plurality of semiconductor chips provided therein in a grid-like arrangement;

testing said plurality of semiconductor chips for electric characteristics thereof;

writing into each of said plurality of semiconductor chips, information of a chip position on said wafer associated with said testing;

storing a first test result from said testing step and storing said chip position information that is associated with said first test result;

dividing said wafer into respective ones of said semiconductor chips to produce semiconductor devices each sealed in a package;

testing each of said semiconductor devices for its electric characteristics to produce second test results;

detecting stored position information of each of said semiconductor devices associated with said second test results after said semiconductor device has been sealed in a package;

storing said second test results and said associated information of said semiconductor device position; and mapping the distribution of failures corresponding to a wafer by combining position information of those chips determined to be faulty in said semiconductor chip testing step and position information of those semiconductor devices determined to be faulty in said semiconductor devices testing step, based on said first test result, said second test result and said information of chip position and semiconductor device position;

determining a cause of failures based on said distribution of failures.

2. A semiconductor device manufacturing method comprising the steps of:

manufacturing a wafer in a manufacturing line, said wafer having a plurality of semiconductor memories provided therein in a grid-like arrangement;

wafer testing said semiconductor memories for electric characteristics thereof;

determining in a trimming device a redundancy address for a redundancy memory of each semiconductor memory and blowing fuses corresponding to said redundancy address;

storing, in a wafer test information storage device, said redundancy address and position information on said wafer of said redundancy memory that is associated with said redundancy address;

dividing, in a package assembling device, said wafer into respective ones of said semiconductor memories to produce semiconductor memories each sealed in a package;

after said dividing step, testing, in a product tester, each semiconductor memory for its electric characteristics and reading a replacement address;

estimating, in a position estimating device, position information by comparing said read replacement address with said redundancy address;

storing, in a product test information storage device, a second test result outputted from said product tester and said position information detected by said position estimating device that is associated with said second test result;

mapping, in a failure distribution mapping device, the distribution of failures by associating said second test result with said position information; and determining a cause of failures based on said distribution of failures.

3. A semiconductor device manufacturing method comprising the steps of:
- manufacturing, in a manufacturing line, a wafer with a plurality of semiconductor memories provided therein in a grid-like arrangement;
- testing, in a wafer tester, said semiconductor memories for electric characteristics thereof;
- determining, in a trimming device, a replacement address for a redundancy memory of each semiconductor memory and blowing fuses corresponding to said replacement address;
- storing, in a position information storage device, said replacement address and position information on said wafer that is associated with said replacement address;
- dividing, in a package assembling device, said wafer into respective ones of said semiconductor memories to produce semiconductor memories each sealed in a package;
- testing, in a product tester, each semiconductor memory for its electric characteristics and reading a replacement address;
- estimating, in a position estimating device, position information by comparing said read replacement address with said replacement address stored in said position information storage device;
- storing, in a product test information storage device, a first test result outputted by said wafer tester, a second test result outputted from said product tester and said position information on said wafer estimated by said position estimating device in association with one another;
- mapping, in a failure distribution mapping device and based on said first test result, said second test result and said position information, the distribution of failures by combining position information of those semiconductor memories determined to be faulty by said wafer tester and position information of those semiconductor memories determined to be faulty by said product tester; and
- determining a cause of failures based on said distribution of failures.

4. A semiconductor device manufacturing method for estimating the location of a cause of a failure based on a test result of a manufactured semiconductor device comprising the steps of:
- electronically reading, in a position information reading device, chip data previously written in a predetermined circuit of said semiconductor device after this semiconductor device has been sealed into a package;
- extracting, in a position information extracting device, a lot number of said semiconductor device in a wafer process, a wafer number of a wafer in said lot and position information on said wafer based on said chip data; and
- determining, in a failure cause determining device, a cause of a failure which has occurred after division of said wafer into chips by combining respective test results before and after said division into a single distribution of failures.

5. A semiconductor device manufacturing method according to claim 4, wherein said determining step determines a cause of a failure in a wafer process based on said position information of that semiconductor device which is determined to be faulty in a test of semiconductor devices after sealing into packages.

6. A semiconductor device manufacturing method according to claim 4, wherein said position information is a replacement address for replacing a faulty memory cell, said method further comprising the steps of:
- generating, in a reference table mapping device, a reference table showing a relation between said position information and said replacement address in a test for determining whether a semiconductor device in a wafer state is faulty or non-defective, and
- extracting, in said position information extracting device, position information of said semiconductor device after sealing into a package from said reference table based on address data read from said sealed semiconductor device.

7. A semiconductor device manufacturing method according to claim 4, further comprising the steps of:
- storing, using a data writing device, trimming data in a storage circuit during a test for determining whether a semiconductor device in a wafer state is faulty or non-defective;
- reading, in a data reading device, said trimming data from said storage circuit;
- mapping, in a reference table mapping device, a reference table showing a relation between said position information and said trimming data; and
- extracting, using said position information extracting device and based on trimming data read from said semiconductor device, said position information of semiconductor devices corresponding to the trimming data from said reference table.

* * * * *